US008875653B2

(12) United States Patent
Cobb et al.

(10) Patent No.: US 8,875,653 B2
(45) Date of Patent: Nov. 4, 2014

(54) MICRO-EXTRUSION PRINTHEAD WITH OFFSET ORIFICES FOR GENERATING GRIDLINES ON NON-SQUARE SUBSTRATES

(75) Inventors: Corie Lynn Cobb, Mountain View, CA (US); Scott E. Solberg, Mountain View, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 215 days.

(21) Appl. No.: 13/371,348

(22) Filed: Feb. 10, 2012

(65) Prior Publication Data

US 2013/0206062 A1  Aug. 15, 2013

(51) Int. Cl.
| | |
|---|---|
| B05C 11/00 | (2006.01) |
| B05B 7/06 | (2006.01) |
| B05C 3/02 | (2006.01) |
| B05D 5/12 | (2006.01) |
| B05D 5/00 | (2006.01) |
| A21C 3/00 | (2006.01) |
| B29C 45/00 | (2006.01) |

(52) U.S. Cl.
USPC ........... 118/684; 118/663; 118/669; 118/313; 118/411; 427/286; 427/58; 425/131.1; 264/510

(58) Field of Classification Search
CPC .. B05C 11/1002; B05C 5/0279; B05C 5/027; B05C 5/0275; B05C 9/06; B05C 5/0225; B05B 12/121472
USPC ............. 118/684, 313, DIG. 4, 710; 425/145, 425/131.1, 132, 133.5, 462, 463
See application file for complete search history.

(56) References Cited

U.S. PATENT DOCUMENTS

| | | | |
|---|---|---|---|
| 2,031,387 A | 2/1936 | Schwarz | |
| 2,326,803 A | 8/1943 | Samiran | |

(Continued)

FOREIGN PATENT DOCUMENTS

| | | |
|---|---|---|
| DE | 102006011580 B3 | 10/2007 |
| EP | 1787786 A | 5/2007 |

(Continued)

OTHER PUBLICATIONS

Finlayson et al. "Bi2O3—Wo3 compounds for photocatalytic applications by solid state and viscous processing", Title from a conference scheduled for Oct. 6-7, 2004 in Munich, 8 pages.

(Continued)

*Primary Examiner* — Dah-Wei D Yuan
*Assistant Examiner* — Karl Kurple
(74) *Attorney, Agent, or Firm* — Bever, Hoffman & Harms, LLP; Patrick T. Bever

(57) ABSTRACT

A solar cell extrusion printing system that uses a micro-extrusion printhead to print longer central gridlines and one or more pairs of shorter "side" gridlines such that end points of the gridline sets form step patterns on an octagonal (pseudo-square) substrate. The printhead includes a set of central nozzles that receive ink from a first valve by way of a first flow channel to print the longer central gridlines, and additional sets of side nozzles that receive ink from additional valves by way of additional flow channels to print the shorter "side" gridlines. The central nozzles have outlet orifices that offset in the process direction from side outlet orifices of the side nozzles. A start signal is simultaneously sent to the valves such that ink is substantially simultaneously extruded through both the central and side orifices, whereby the extruded ink produces gridline endpoints having the desired step pattern.

14 Claims, 19 Drawing Sheets

(56) References Cited

U.S. PATENT DOCUMENTS

| | | | |
|---|---|---|---|
| 2,761,791 A | 9/1956 | Russell | |
| 2,789,731 A | 4/1957 | Marraffno | |
| 3,032,008 A | 5/1962 | Land et al. | |
| 3,159,313 A | 12/1964 | Guilford | |
| 3,602,193 A | 8/1971 | Adams et al. | |
| 4,018,367 A | 4/1977 | Morine et al. | |
| 4,119,058 A | 10/1978 | Schmermund | |
| 4,141,231 A | 2/1979 | Kudlich | |
| 4,254,894 A | 3/1981 | Fetters | |
| 4,301,322 A | 11/1981 | Amick | |
| 4,356,217 A * | 10/1982 | Wollam et al. | 427/286 |
| 4,411,218 A * | 10/1983 | Wollam et al. | 118/411 |
| 4,418,640 A | 12/1983 | Dettelbach et al. | |
| 4,420,510 A | 12/1983 | Kunkel et al. | |
| 4,461,403 A | 7/1984 | Prahs | |
| 4,476,165 A * | 10/1984 | McIntyre | 427/258 |
| 4,488,665 A * | 12/1984 | Cocks et al. | 222/146.5 |
| 4,490,418 A | 12/1984 | Yoshida | |
| 4,521,457 A * | 6/1985 | Russell et al. | 427/286 |
| 4,747,517 A | 5/1988 | Hart | |
| 4,774,109 A * | 9/1988 | Hadzimihalis et al. | 427/286 |
| 4,938,994 A * | 7/1990 | Choinski | 427/96.1 |
| 4,976,999 A * | 12/1990 | Ishizuka | 427/420 |
| 4,985,715 A | 1/1991 | Cyphert et al. | |
| 5,000,988 A | 3/1991 | Inoue et al. | |
| 5,120,484 A | 6/1992 | Cloeren | |
| 5,151,377 A | 9/1992 | Hanoka et al. | |
| 5,188,789 A | 2/1993 | Nishiura | |
| 5,254,388 A | 10/1993 | Melby et al. | |
| 5,335,825 A * | 8/1994 | Fort | 222/1 |
| 5,353,813 A | 10/1994 | Deevi et al. | |
| 5,533,675 A * | 7/1996 | Benecke et al. | 239/413 |
| 5,536,313 A | 7/1996 | Watanabe et al. | |
| 5,560,518 A | 10/1996 | Catterall et al. | |
| 5,590,818 A | 1/1997 | Raba et al. | |
| 5,605,720 A | 2/1997 | Allen et al. | |
| 5,679,379 A | 10/1997 | Fabbricante et al. | |
| 5,685,911 A * | 11/1997 | Raterman et al. | 118/669 |
| 5,700,325 A * | 12/1997 | Watanabe | 118/411 |
| 5,720,820 A * | 2/1998 | Boger et al. | 118/669 |
| 5,725,814 A * | 3/1998 | Harris | 264/40.3 |
| 5,733,608 A | 3/1998 | Kessel et al. | |
| 5,756,163 A * | 5/1998 | Watanabe | 427/424 |
| 5,770,129 A * | 6/1998 | Monti | 264/40.1 |
| 5,873,495 A | 2/1999 | Saint-Germain | |
| 5,918,771 A | 7/1999 | van der Heijden | |
| 6,047,862 A | 4/2000 | Davies | |
| 6,184,458 B1 | 2/2001 | Murakami et al. | |
| 6,248,171 B1 * | 6/2001 | Gurer et al. | 118/300 |
| 6,257,450 B1 | 7/2001 | Jackson et al. | |
| 6,270,335 B2 * | 8/2001 | Leyden et al. | 425/375 |
| 6,293,498 B1 | 9/2001 | Stanko et al. | |
| 6,375,311 B1 | 4/2002 | Kuramoto | |
| 6,398,370 B1 | 6/2002 | Chiu et al. | |
| 6,418,986 B1 | 7/2002 | Gabriele | |
| 6,423,140 B1 | 7/2002 | Liu et al. | |
| 6,529,220 B1 | 3/2003 | Matsumoto | |
| 6,534,129 B1 * | 3/2003 | Miller et al. | 427/466 |
| 6,558,146 B1 | 5/2003 | Shah et al. | |
| 6,666,165 B2 | 12/2003 | Shiraishi et al. | |
| 6,669,779 B2 * | 12/2003 | Gurer et al. | 118/300 |
| 6,689,215 B2 * | 2/2004 | Nguyen | 118/313 |
| 6,695,923 B1 * | 2/2004 | Schultz et al. | 118/679 |
| 6,697,694 B2 * | 2/2004 | Mogensen | 700/119 |
| 6,743,478 B1 | 6/2004 | Kiiha et al. | |
| 6,749,414 B1 * | 6/2004 | Hanson et al. | 425/130 |
| 6,863,923 B1 | 3/2005 | Kalleder et al. | |
| 6,890,167 B1 * | 5/2005 | Kwok et al. | 425/72.2 |
| 6,955,348 B2 | 10/2005 | Koga | |
| 6,998,087 B1 * | 2/2006 | Hanson et al. | 264/308 |
| 7,040,555 B2 * | 5/2006 | Miinalainen et al. | 239/562 |
| 7,101,592 B2 | 9/2006 | Gueggi et al. | |
| RE39,399 E * | 11/2006 | Allen | 425/7 |
| 7,160,574 B1 | 1/2007 | Gillanders et al. | |
| 7,255,896 B2 * | 8/2007 | Kawabe | 427/318 |
| 7,332,035 B1 * | 2/2008 | Tudor et al. | 118/315 |
| 7,467,452 B2 * | 12/2008 | Lande et al. | 29/407.09 |
| 7,765,949 B2 | 8/2010 | Fork et al. | |
| 7,780,812 B2 | 8/2010 | Fork et al. | |
| 7,799,371 B2 * | 9/2010 | Fork et al. | 427/115 |
| 8,707,891 B2 * | 4/2014 | Arnaboldi | 118/411 |
| 2001/0046551 A1 * | 11/2001 | Falck et al. | 427/8 |
| 2001/0053420 A1 | 12/2001 | Donges et al. | |
| 2002/0083895 A1 | 7/2002 | Nakamura et al. | |
| 2002/0166232 A1 * | 11/2002 | Fujita et al. | 29/890.1 |
| 2003/0015820 A1 | 1/2003 | Yamazaki et al. | |
| 2003/0084845 A1 * | 5/2003 | Prentice et al. | 118/679 |
| 2003/0180409 A1 * | 9/2003 | Kazmer et al. | 425/145 |
| 2003/0201581 A1 | 10/2003 | Weber et al. | |
| 2004/0247794 A1 * | 12/2004 | Tokimasa et al. | 427/421.1 |
| 2004/0259382 A1 | 12/2004 | Nishimura et al. | |
| 2004/0265407 A1 | 12/2004 | Prugh et al. | |
| 2005/0037145 A1 * | 2/2005 | Kawabe | 427/299 |
| 2005/0067729 A1 | 3/2005 | Laver et al. | |
| 2005/0194037 A1 | 9/2005 | Asai | |
| 2005/0221613 A1 | 10/2005 | Ozaki et al. | |
| 2005/0241575 A1 * | 11/2005 | Schneider | 118/410 |
| 2006/0060135 A1 * | 3/2006 | Rankin et al. | 118/412 |
| 2006/0158473 A1 | 7/2006 | Mills et al. | |
| 2006/0251796 A1 * | 11/2006 | Fellingham | 427/8 |
| 2007/0108229 A1 * | 5/2007 | Fork et al. | 222/129 |
| 2007/0110836 A1 | 5/2007 | Fork et al. | |
| 2007/0209697 A1 | 9/2007 | Karakida et al. | |
| 2008/0029152 A1 | 2/2008 | Milshtein et al. | |
| 2008/0110939 A1 * | 5/2008 | Frates | 222/504 |
| 2008/0138456 A1 | 6/2008 | Fork et al. | |
| 2009/0101190 A1 | 4/2009 | Salami et al. | |
| 2010/0116199 A1 | 5/2010 | Fork et al. | |
| 2010/0117254 A1 | 5/2010 | Fork et al. | |
| 2011/0052811 A1 * | 3/2011 | McGuffey | 427/256 |
| 2011/0052812 A1 * | 3/2011 | McGuffey | 427/256 |
| 2012/0156364 A1 * | 6/2012 | Fork et al. | 427/58 |
| 2012/0180936 A1 * | 7/2012 | Schuler | 156/109 |
| 2014/0034682 A1 * | 2/2014 | McGuffey | 222/255 |

FOREIGN PATENT DOCUMENTS

| | | |
|---|---|---|
| EP | 1918245 B2 | 5/2008 |
| JP | 60082680 A | 5/1985 |
| JP | 05-031786 A | 2/1993 |
| JP | 2005051216 | 2/2005 |
| WO | 91/15355 | 10/1991 |
| WO | 00/50215 | 8/2000 |
| WO | 03/076701 A | 9/2003 |
| WO | 2005/070224 A1 | 8/2005 |
| WO | 2005/107957 A1 | 11/2005 |
| WO | 2005/107958 A1 | 11/2005 |
| WO | WO2010061394 A1 | 6/2010 |

OTHER PUBLICATIONS

Mueller et al. "Breathable Polymer Films Produced by the Microlayer Coextrusion Process", Journal of Applied Polymer Science, vol. 78, pp. 816-828, 2000.

Schweizer, Peter M. "Curtain Coating Technology Can Mean Big Benefits", Paper, Film & Foil Converter website, Mar. 1, 2000, 5 pages, http://pffc-online.com/mag/paper_curtain_coating_technology/.

Extrusion/Coextrusion Dies, Extrusion Dies Industries, LLC, http://www.extrusiondies.com/PRODUCTS/ExtrusionDies/multimanifoldDies.html, 1 page.

Citsco, Gimac Compact Triplex TR12 Micro-Coextrusion Plant, NPE 2000, Jun. 19-23, 2000, McCormick Place, Chicago, IL, Booth 13154, http://www.citsco.com/NPE2000/npepage1.html, 2 pages.

Rao et al. "Microfabricated Deposition Nozzles for Direct-Write Assembly of Three-Dimensional Periodic Structures", Advanced Materials, vol. 17, No. 3, Feb. 10, 2005, pp. 289-293.

Van Hoy et al. "Microfabrication of Ceramics by Co-extrusion", J. Am. Ceram. Soc., vol. 81, No. 1, pp. 152-158, 1998.

(56) References Cited

OTHER PUBLICATIONS

Duncan, A. B. et al. "Charge Optimization for a Triangular-Shaped Etched Micro Heat Pipe", J. Thermophysics, 1994, vol. 9, No. 2, Technical Notes, pp. 365-368.

Joshi et al. "Micro and Meso Scale Compact Heat Exchangers in Electronics Thermal Management—A Review", Proc. of 5th Int. Conf. on Enhanced, Compact and Ultra-Compact Heat Exchangers: Science, Engineering and Technology, Eda. R. K. Shah et al., Engineering Conferences International, Hoboken, NJ, USA, Sep. 2005, pp. 162-179.

Le Berre et al. "Fabrication and experimental investigation of silicon micro heat pipes for cooling electronics", J. Micromech. Microeng. 13 (2003) 436-441.

Sobhan, Choondal B. "Modeling of the Flow and Heat Transfer in Micro Heat Pipes", ASME 2nd International Conference on Microchannels and Minichannels, 2004, pp. 883-890.

Sobhan, C. B. et al. "A review and comparative study of the investigations on micro heat pipes", Int. J. Energy Res., 2007, vol. 31, pp. 664-688.

Wang, Y. X. et al. "Investgaton of the Tempertue Disrbuton on Radiator Fins with Micro Heat Pipes", J. Thermophysics and Heat Transfer, vol. 15, No. 1, Jan.-Mar. 2001, pp. 42-49.

* cited by examiner

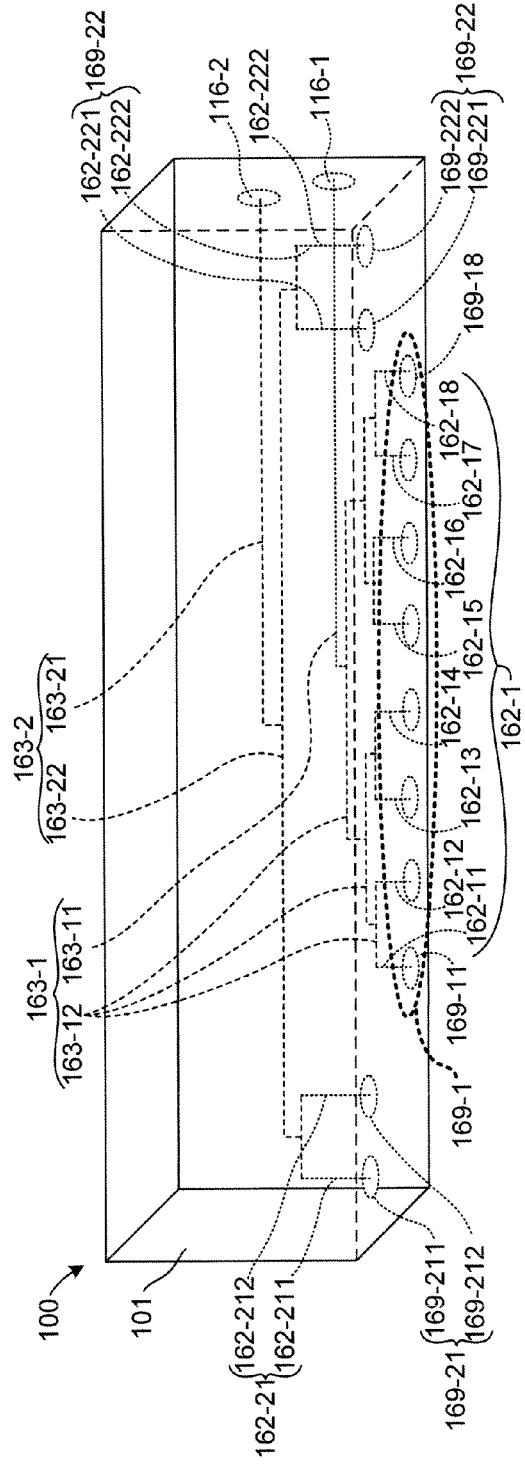
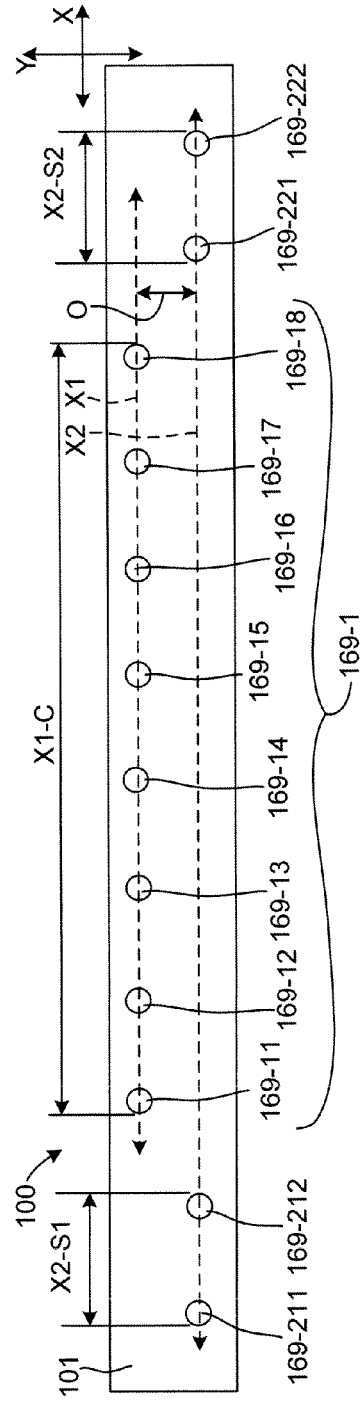
FIG. 2(A)
FIG. 2(B)

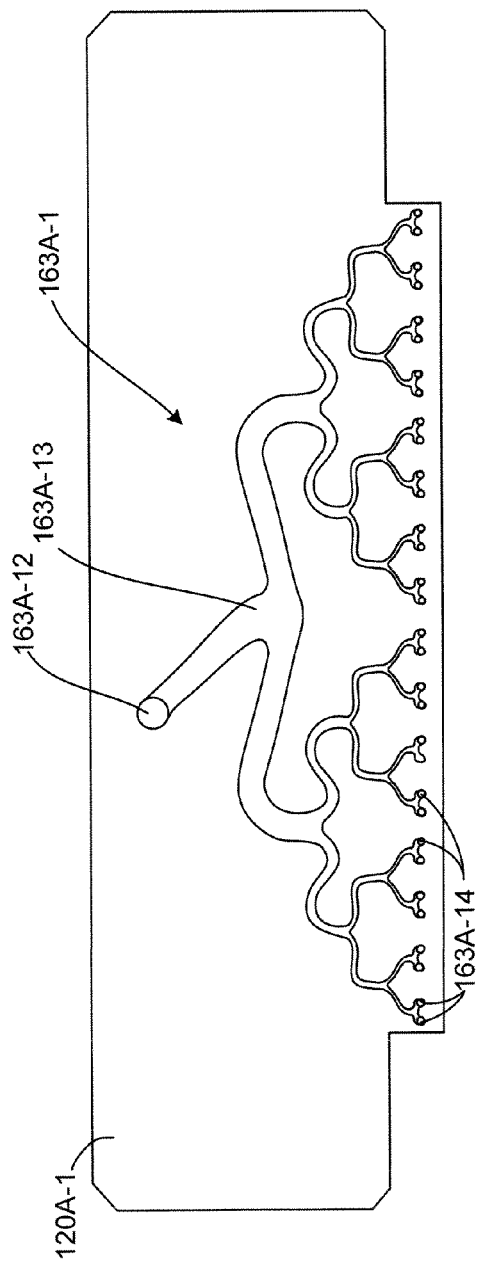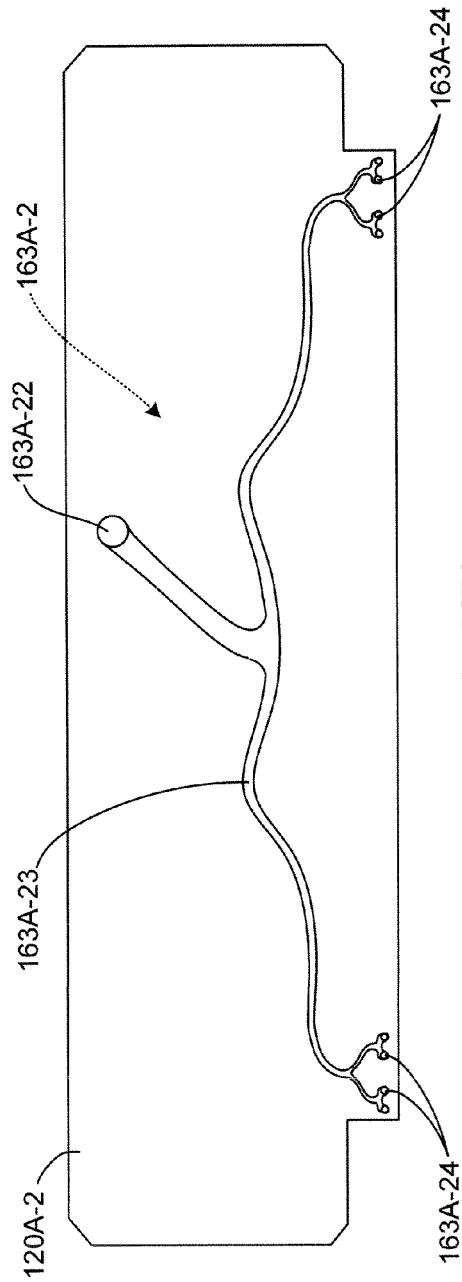
FIG. 6(A)
FIG. 6(B)

2

MICRO-EXTRUSION PRINTHEAD WITH OFFSET ORIFICES FOR GENERATING GRIDLINES ON NON-SQUARE SUBSTRATES

FIELD OF THE INVENTION

The present invention is related to the production of wafer-based electronic devices, and more particularly to the production of frontside metallization on H-pattern solar cells using micro-extrusion techniques.

BACKGROUND

FIG. 15 is a simplified diagram showing an exemplary conventional H-pattern contact solar cell 40H that converts sunlight into electricity by the photovoltaic effect. Solar cell 40H is formed on a semiconductor (e.g., poly-crystalline or mono-crystalline silicon) substrate 41H that is processed using known techniques to include an n-type doped upper region 41U and a p-type doped lower region 41L such that a pn-junction is formed near the center of substrate 41H. Disposed on a frontside surface 42H of semiconductor substrate 41H are a series of parallel metal gridlines (fingers) 44H (shown in end view) that are electrically connected to n-type region 41U. A substantially solid conductive layer 46 is formed on a backside surface 43 of substrate 41H, and is electrically connected to p-type region 41L. An antireflection coating 47 is typically formed over upper surface 42 of substrate 41H. Solar cell 40H generates electricity when a photon from sunlight beams L1 pass through upper surface 42 into substrate 41H and hit a semiconductor material atom with an energy greater than the semiconductor band gap, which excites an electron ("−") in the valence band to the conduction band, allowing the electron and an associated hole ("+") to flow within substrate 41H. The pn-junction separating n-type region 41U and p-type region 41L serves to prevent recombination of the excited electrons with the holes, thereby generating a potential difference that can be applied to a load by way of gridlines 44H and conductive layer 46, as indicated in FIG. 15.

FIGS. 16(A) and 16(B) are perspective views showing the frontside contact patterns of solar cells 40P and 40M, which are respectively formed on a square (or rectangular) poly-crystalline silicon ("poly-silicon") substrate 41P and an octagonal (or other non-square shape) mono-crystalline silicon (mono-silicon) substrate 41M. Both solar cells 40P and 40M have frontside contact patterns consisting of an array of parallel narrow gridlines 44P/44M and one or more wider collection lines (bus bars) 45 that extend perpendicular to gridlines 44P/44M, both gridlines 44P/44M and bus bars 45 being disposed on upper surfaces 42 of substrates 41P and 41M, respectively. In both cases gridlines 44P/44M collect electrons (current) from substrates 41P/41M as described above, and bus bars 45 gather current from gridlines 44P/44M. In a photovoltaic module, bus bars 45 become the points to which metal ribbons (not shown) are attached, typically by soldering, with the ribbon being used to electrically connect one cell to another in a solar panel (i.e., an array of solar cells 40P/40M that are arranged on a common platform that are wired in series or parallel). With both types of solar cells 40P and 40M, the backside contact pattern (not shown) consists of a substantially continuous back surface field (BSF) metallization layer and multiple (e.g., three) spaced apart solder pad metallization structures that serve in a manner similar to bus bars 45 and are also connected to an associated metal ribbon (not shown) used to electrically connect one cell to another.

Those skilled in the art understand that solar cell 40P formed on poly-silicon substrate 41P is typically less expensive to produce than solar cell 40M formed on mono-silicon substrate 41M, but that solar cell 40M is more efficient at converting sunlight into electricity than solar cell 40P, thereby offsetting some of the higher manufacturing costs. Poly-silicon substrates 41P are less expensive to produce than mono-crystalline substrates 41M because the process to produce poly-silicon wafers is generally simpler and thus cheaper than mono-crystalline wafers. Typically, poly-crystalline wafers are formed as square ingots using a cast method in which molten silicon is poured into a cast and then cooled relatively quickly, and then the square ingot is cut into wafers. However, poly-silicon wafers are characterized by an imperfect surface due to the multitude of crystal grain boundaries, which impedes the transmission of sunlight into the cell, which reduces solar energy absorption and results in lower solar cell efficiency (i.e., less electricity per unit area). That is, to produce the same wattage, poly-silicon cells would need to have a larger surface area than their mono-crystalline equivalent, which is important when limited array space is available. In contrast, mono-crystalline substrates (wafers) are grown from a single crystal to form cylindrical ingots using a relatively slow (long) cooling process. The higher production costs associated with solar cells 40M are also partially attributed to the higher cost of producing mono-crystalline wafers 41M, which involves cutting the cylindrical ingot into circular disc-shaped wafers, and then cutting the circular wafers into 'pseudo' square (polygonal) shapes with uniform surfaces (e.g., the octagonal shape shown in FIG. 16(B)) that are efficient for assembly onto into a panel. Note that forming these 'pseudo' square substrates involves cutting away peripheral sections of the circular wafer, which creates a substantial waste of silicon. However, because mono-silicon substrate 41M includes a single-crystal structure, its sunlight transmission is superior to that of poly-silicon substrate 41P, which contributes to its higher operating efficiency.

Conventional methods for producing H-pattern solar cells include screen-printing and micro-extrusion. Screen-printing techniques were first used in the large scale production of solar cells, but has a drawback in that it requires physical contact with the semiconductor substrate, resulting in relatively low production yields. Micro-extrusion methods were developed more recently in order to meet the demand for low cost large-area semiconductors, and include extruding a conductive "gridline" material onto the surface of a semiconductor substrate using a micro-extrusion printhead.

Due to a market bias toward lower cost solar cells, conventional mass-production micro-extrusion systems and printheads are currently optimized to extrude a conductive paste (containing frit along with the conductive material) onto square/rectangular poly-silicon substrates 41P in accordance with the method illustrated in FIG. 17. FIG. 17 is simplified top view depicting the currently used micro-extrusion method for printing gridlines 44P onto frontside surface 42 of poly-silicon substrate 41P during the production of solar cell 40P (which is shown in a completed form in FIG. 16(A)). Poly-silicon substrate 41P is positioned below and moved in a process (Y-axis) direction relative to conventional micro-extrusion printhead 100-PA while gridline material is extruded from multiple nozzle outlet orifices 69-PA that are aligned in the cross-process (X-axis) direction, causing the extruded gridline material to form parallel gridline structures 44P on substrate 41P. The extrusion (gridline printing) process is started, e.g., by way of opening a valve feeding gridline material into printhead 100-PA, when nozzle outlet orifices 69-PA are positioned a predetermined distance from front edge 41P-F of substrate 41P such that leading edges of gridlines 44 are separated from front edge 41P-F by a predetermined gap distance S. Similarly, the gridline printing process is terminated to provide a space between the lagging ends of gridlines 44P-B of substrate 41P. This gap is provided between the front/rear ends of gridlines 44P and the front/rear edges of substrate 41P in order to prevent a possible short-circuit between gridlines 44P and conductors (not shown) that are formed on the backside surface of substrate 41P. In comparison to screen printing techniques, the extrusion of dopant material onto substrate 41P provides superior control of the feature resolution of the conductive regions, and facilitates deposition without contacting substrate 41P, thereby avoiding wafer breakage (i.e., increasing production yields). Such fabrication techniques are disclosed, for example, in U.S. Patent Application No. 20080138456, which is incorporated herein by reference in its entirety.

Another problem faced by mono-crystalline-based solar cells is that current solar cell extrusion printing equipment that is optimized for poly-silicon-based solar cells cannot be used in an efficient manner to make octagonal ("pseudo-square") mono-crystalline-based solar cells. This problem is illustrated in FIG. 18, which depicts the use of conventional printhead 100-PA to generate gridlines 44P on an octagonal mono-crystalline silicon substrate 41M. That is, conventional printhead 100-PA and the associated micro-extrusion system typically are incapable of individually controlling extrusion material passed though nozzle outlet orifices 69-PA, whereby gridlines 44P disposed along the side edges of substrate 41M extend over chamfered edges 41M-C1 and 41M-C3 (as indicated by the dashed-line circles in FIG. 18), thereby probably producing a short-circuit between gridlines 44P and conductors (not shown) that are formed on the backside surface of substrate 41M. One possible solution to this problem would be to provide a mask on the corner regions, or to remove the overlapping gridline portions. This approach would allow the use of currently available equipment, but would greatly increases manufacturing costs, would potentially reduce yields by requiring substantial pre-extrusion or post-extrusion processing of the octagonal mono-silicon wafers, and would also waste gridline material. Another possible approach would be to modify the printhead to include an individual valve for each outlet orifice, and modifying the system to facilitate individually controlling the valves such that the endpoints of each extruded gridline could be formed with the desired gap distance, whether formed along an end or chamfered edge of the substrate. However, this approach would require significant (and very expensive) changes to the micro-extrusion control system, and would be difficult to implement due to the large number of valves that would be required. Moreover, adding a large number of external valves to the existing co-extrusion system is problematic due to space limitations and payload on the existing micro-extrusion systems utilized to generate solar cells on square poly-silicon substrates.

What is needed is a method for forming gridlines on octagonal mono-crystalline silicon substrates that avoids the problems mentioned above in association with the conventional gridline printing process. What is also needed is a micro-extrusion printhead assembly that facilitates implementation of the method with minimal required modification of existing micro-extrusion systems.

SUMMARY OF THE INVENTION

The present invention is directed to a micro-extrusion printhead and system that are optimized for the production of H-pattern solar cells on octagonal (or other non-square/non-rectangular shaped) semiconductor (e.g., mono-crystalline silicon) substrates such that longer "central" and shorter "side" sets of parallel gridlines are simultaneously extruded onto the substrate surface in a way that causes the gridlines' endpoints to form "step" patterns. The parallel gridlines are extruded (printed) in a process direction on the substrate surface, and the printing process is controlled such that within each set of gridlines, the gridlines have substantially the same length, with their endpoints being substantially aligned. The longer gridlines are disposed in a central region of the substrate that is defined by the substrate's front and back edges, with the endpoints of each longer gridline disposed at a predetermined gap distance from the substrate's front and back edges. At least two sets of shorter gridlines are printed on opposite sides of central region, with one set extending between two associated chamfered corners along one of the substrate's side edges, and the other set extending between the other two chamfered corners along the substrate's other side edge. The common length of the shorter gridlines is set such that outermost endpoints of the two outermost short gridlines disposed closest to the side substrate's side edges are offset from the chamfered corners by a predetermined distance. Although the resulting step pattern does not optimize wafer surface coverage of the shorter gridlines in the area of the chamfered corners, the present inventors have found that producing H-pattern solar cells in this manner provides significant production advantages that greatly offset the very minor loss in cell electrical efficiency caused by offset "step" gridline pattern, and the number of steps can be selected to trade-off manufacturing complexity and cost versus cell efficiency. With respect to co-extruded gridlines, the production advantages of printing a stepped pattern on octagonal wafers include: minimal ink waste, no corner masking required, no chance of printing beyond wafer edge (which could possibly short-circuit the cell), and such stepped-printing sub-system could be substituted for a conventional micro-extrusion printing sub-system on the same machine with minimal effort and delay.

In accordance with an embodiment of the present invention, a micro-extrusion printhead utilized to print gridlines in the desired "step" pattern described above includes nozzle channels having outlet orifices disposed in an offset arrangement to form the desired offset "step" pattern of the gridline endpoints on a target substrate. That is, similar to the gridline endpoints, the printhead includes a centrally disposed set of outlet orifices that are aligned in a cross-process direction, and two "side" sets of outlet orifices that are also aligned in the cross-process direction, where the "side" sets of outlet orifices are offset (spaced) in the process direction from the central set of outlet orifices by an offset distance. Central outlet orifices are disposed in a central region of the printhead, and receive gridline material from an associated inlet port by way of an associated flow channel and associated nozzle channels. The two sets of "side" outlet orifices are respectively positioned in side regions that are disposed outside of the central region in the cross-process direction, and receive gridline material from an associated inlet port by way of an associated flow channel and associated nozzle channels. To facilitate generating gridlines in the "step" pattern, the "side" outlet orifices are disposed downstream (i.e., in the process direction) from the "central" outlet orifices by the predetermined offset distance. An advantage of providing a printhead with the "central" and "side" orifices in this offset pattern is that gridline material flow through the printhead to all of the orifices can be initiated using a single "start" (valve open) signal. That is, with this arrangement, when gridline material is simultaneously extruded through the "central" and "side" outlet orifices, the extruded gridline material inherently forms parallel gridlines with start points having the desired "step" pattern. Starting to dispense paste for all sets of nozzles at substantially the same time has the advantage of ensuring that all gridlines have start points which appear similar (desirable for cosmetic reasons); otherwise, due to extruded paste flow differences between initial and fully-developed flow (and an unpredictable transition between those flow regimes), there would be problems matching the later starts of the outer sets of gridlines to the earlier starts of the central zone because the print motion is necessarily the same for the entire head.

In accordance with an embodiment of the present invention, a micro-extrusion system utilized to produce solar cells on octagonal ('pseudo square') mono-crystalline silicon substrates in accordance with the step-pattern printing approach set forth above differs from conventional micro-extrusion systems in several respects. First, the conventional printhead used in the conventional system is replaced with a micro-extrusion printhead having central nozzle orifices and side nozzle orifices that are arranged in the offset manner that substantially mirrors the desired step pattern formed by the gridline endpoints on the target substrate. Next, the singular flow of "gridline material" into the printhead of the conventional system is replaced with separate valves that control the flow of gridline material to each set of central and side nozzle orifices. Further, the micro-extrusion system of the present invention includes an enhanced controller that individually controls the opened/closed state of the two valves in the manner described below to generate gridlines in the desired offset "step" pattern. The separate valves are connected between a material feed system and respective inlet ports of the printhead. A first valve is used to supply a first portion of the gridline material into a first inlet port of the printhead, whereby the first gridline material portion is distributed inside the printhead and extruded through the central nozzle orifices. A second valve is used to supply a second portion of the gridline material through a second printhead inlet port, whereby the second gridline material portion is distributed and extruded through the two sets of side nozzle orifices. Additional valves are provided to supply gridline material through additional printhead inlet ports for each additional set of side nozzle orifices. The controller is configured to simultaneously transmit an "print-start" (open) control signal at a print start time (i.e., when the central orifices are positioned at a required gap distance from the front edge of a target substrate), whereby all of the valves are substantially simultaneously opened to extrude gridline material from each set of orifices onto the target substrate. When each set of side gridlines has the required length (i.e., when the outermost side orifices of each side orifice set is positioned at the required gap distance from associated chamfered edges of the target substrate), the controller sends an associated close command to the associated valve, thereby terminating extrusion of gridline material through the associated side nozzle orifices. At the end of the print operation (i.e., when the central orifices are positioned at the required gap distance from the back edge of the target substrate), the controller sends another close command to the first valve, thereby terminating extrusion of gridline material through the central nozzle orifices. The advantage of this modified system is that the novel gridline printing method described herein is implemented with minimal modifications to existing micro-extrusion printheads that are utilized in the production of H-pattern solar cells on poly-silicon wafers, thus allowing the production of higher efficiency H-pattern solar cells on mono-crystalline silicon wafers without requiring large retooling costs.

In accordance with an exemplary embodiment of the present invention, the micro-extrusion printhead is constructed as a multi-layer printhead assembly including at least two nozzle layers that separately define the offset nozzle outlet orifices. Specifically, a first nozzle layer is formed to include the first "central" set of outlet orifices, and a second nozzle layer of the printhead assembly includes two "side" sets of outlet orifices. The multi-layer printhead assembly is assembled by way of fasteners (e.g., bolts) with the nozzle layers spaced such that the first nozzle layer separated from the second nozzle layer by a distance determined by the desired offset distance between the central and side gridline endpoints defining the desired printed "step" pattern. An advantage provided by constructing the micro-extrusion printhead as a multi-layer assembly is that adjustment of the offset distance is facilitated, for example, by way of adding or subtracting spacing layers (shims) disposed between the two nozzle layers. Another advantage provided by constructing the micro-extrusion printhead as a multi-layer assembly is the time and cost savings resulting from using similar printhead design and construction methods as used in conventional micro-extrusion printheads for square wafers.

In accordance with an exemplary specific embodiment, the multi-layer printhead assembly includes a plenum layer for each group of nozzle layers (i.e. a single set for the central group, and pairs of sets for outer groups), where each plenum layer defines a flow distribution system that distributes ink to each of the nozzles. The use of separate plenum layers simplifies the flow distribution system design by allowing each flow distribution system to be formed on a separate structure using methods utilized by conventional micro-extrusion printheads, and takes advantage of the required spacing between the nozzle layers. To minimize modification to the existing micro-extrusion system, the multi-layer printhead assembly is provided with intra-layer flow channels that pass through "upstream" (preceding) plenum and nozzle layers to supply material to the "downstream" plenum/nozzle layers. According to a specific embodiment, the flow distribution system of each plenum layer is symmetrical such that uniform extrusion pressures are achieved at the nozzle outlet orifices.

In accordance another specific embodiment, a "two-step" gridline pattern is generated by a three-part multi-layer printhead assembly that includes three nozzle layers and three plenum layers sandwiched between top and bottom plates. The production and operational advantages of the three-part multi-layer printhead assembly the same as those described above, and the additional nozzle layer facilitates the production of two additional sets of shorter "side" gridlines having different lengths, whereby a two-step pattern is generated on the target substrate that provides greater gridline coverage of the wafer surface that improves cell efficiency. In accordance a specific embodiment, the micro-extrusion system utilizes a three-part multi-layer printhead assembly that includes three nozzle layers and three plenum layers sandwiched between top and bottom plates to produce solar cells having "two-step" gridline endpoint patterns using a printhead assembly having central, inner side and outer side nozzle orifices disposed in a "two-step" offset arrangement, three valves that respectively feed gridline material to the central, inner side and outer side nozzle orifices, and a modified controller that simultaneously opens all three valves at the beginning of the printing process to form a first two-step gridline endpoint pattern at a front edge of the target substrate, then sequentially closes the valves at the end of the printing process to form a second two-step gridline endpoint pattern at a back edge of the target substrate. The production and operational advantages of the "two-step" multi-layer system substantially the same as those described above, with an additional advantage being that the two sets of shorter "side" gridlines having different lengths provide greater gridline coverage than the single-step approach, which improves the operating efficiency of the resulting solar cells.

In accordance with another embodiment of the present invention, system utilizes the two or more "gridline material" dispense valves to both control the start/stop of gridline material flow, and to regulate the flow pressure and flow rate such that the gridline material is extruded through each set of orifices at substantially the same outlet flow rate, thereby generating uniform gridline structures from all of the orifices. Directly dispensing gridline material by pressurizing and de-pressurizing a large container of gridline material paste is too slow for the type of "stop-on-the-fly" (that is, stopping the flow of gridline material while the printhead is still moving relative to target substrate) printing utilized in gridline printing systems. This problem is especially important when printing the stepped gridline patterns associated with the present invention on pseudo-square substrates due to the separate "stop flow" events needed for the central and each set of side orifices. Moreover, because the number of central nozzles/orifices is typically much larger than the number of side orifices, the different pressure drops through the associated flow channels require different inlet pressures to produce substantially the same outlet flow rate at both the side and central orifices. Accordingly, the system of the present invention addresses these start/stop and pressure regulation issues by providing a pressurized gridline material source (e.g., single pressurized container) that supplies gridline material to all of the dispense valves at a first pressure, and by utilizing the dispense valves to control the start/stop of gridline material to the printhead, thereby providing superior start/stop control of the gridline material flow than is possible by pressurizing/depressurizing large storage vessels. In addition, the open operating state of each of the dispense valves is individually pre-adjusted (i.e., calibrated/pre-configured) such that each valve transmits a corresponding portion of the gridline material into a corresponding inlet port at a corresponding inlet pressure. By individually pre-adjusting the open operating state of each of the dispense valves to a suitable open operating state, the gridline material is extruded through all of the orifices at substantially the same flow rate.

According to a specific embodiment of the present invention, each dispense valve utilized to control the flow of gridline material in the micro-extrusion system includes a spool-type valve mechanism generally made up of an outer case containing a fixed seal structure, a movable piston, and an actuator. The outer case is a container wall surrounding an inner chamber through which material flows by way of a valve inlet port and a valve outlet port. The fixed seal structure is disposed inside the case's chamber and includes a seal (e.g., an o-ring, gasket or cup-seal) that defines a central opening. A piston including a shaft extending through a first chamber portion and has a stopper positioned near the central opening. An actuator disposed outside of the outer case, and is responsive to "print-start" and "print-stop" command signals to move the piston between an opened operating state, where the stopper is positioned away from the seal structure, and a closed position, where the stopper is positioned to block the flow of material through the central opening. An advantage of this spool-type valve arrangement is that the output flow rate is individually pre-adjustable (calibrated) for each dispense valve by adjusting the position of stopper relative to central opening when the valve is in the "opened" position.

In accordance with yet another embodiment of the present invention, the micro-extrusion system is further modified to produce solar cells having one- or two-step gridline endpoint patterns where the gridlines are co-extruded structures including high aspect ratio gridline material structures supported between sacrificial material portions. As with the embodiments set forth above, the printhead assembly includes central, inner side and outer side nozzle orifices disposed in a "two-step" offset arrangement, three dispense valves that respectively feed gridline material to the central, inner side and outer side nozzle orifices, and a modified controller that simultaneously opens all three valves at the beginning of the printing process to form a first two-step gridline endpoint pattern at a front edge of the target substrate, then sequentially closes the valves at the end of the printing process to form a second two-step gridline endpoint pattern at a back edge of the target substrate. In addition to gridline material flow channels and associated control valves, the co-extrusion printhead assembly includes a second set of flow channels that receive a sacrificial material (e.g., a non-conductive paste) by way of a second set of control valves, whereby the sacrificial material is distributed to each three-part nozzle structures with an associated gridline material flow. Each three-part nozzle structure includes two side flow channels that merge with a central flow channel at a merge point located immediately before the nozzle's outlet orifice, whereby the sacrificial material is co-extruded with the gridline material in a way that forms fine, high aspect ratio gridline structures on the target substrate. The advantage of forming gridlines in this manner is improved current flow due to the thicker gridline material layer disposed on the substrate surface.

BRIEF DESCRIPTION OF THE DRAWINGS

These and other features, aspects and advantages of the present invention will become better understood with regard to the following description, appended claims, and accompanying drawings, where:

FIGS. 2(A) and 2(B) are exploded perspective and bottom views showing a simplified micro-extrusion printhead assembly used by the micro-extrusion system of FIG. 1 in accordance with another embodiment of the present invention;

FIGS. 6(A) and 6(B) are top views showing plenum structures utilized in the multi-layer micro-extrusion printhead assembly of FIG. 5 according to another specific embodiment of the present invention;

DETAILED DESCRIPTION

The present invention relates to an improvement in micro-extrusion systems, and more particularly to micro-extrusion systems used in the production of solar cells. The following description is presented to enable one of ordinary skill in the art to make and use the invention as provided in the context of a particular application and its requirements. As used herein, directional terms such as "upper", "top", "lower", "bottom", "vertical", "horizontal", "front", "back", "side", "central", "process" and "cross-process" are intended to provide relative positions for purposes of description, and are not intended to designate an absolute frame of reference. Various modifications to the preferred embodiment will be apparent to those with skill in the art, and the general principles defined herein may be applied to applications other than the production of solar cells. Therefore, the present invention is not intended to be limited to the particular embodiments shown and described, but is to be accorded the widest scope consistent with the principles and novel features herein disclosed.

Figure 1:
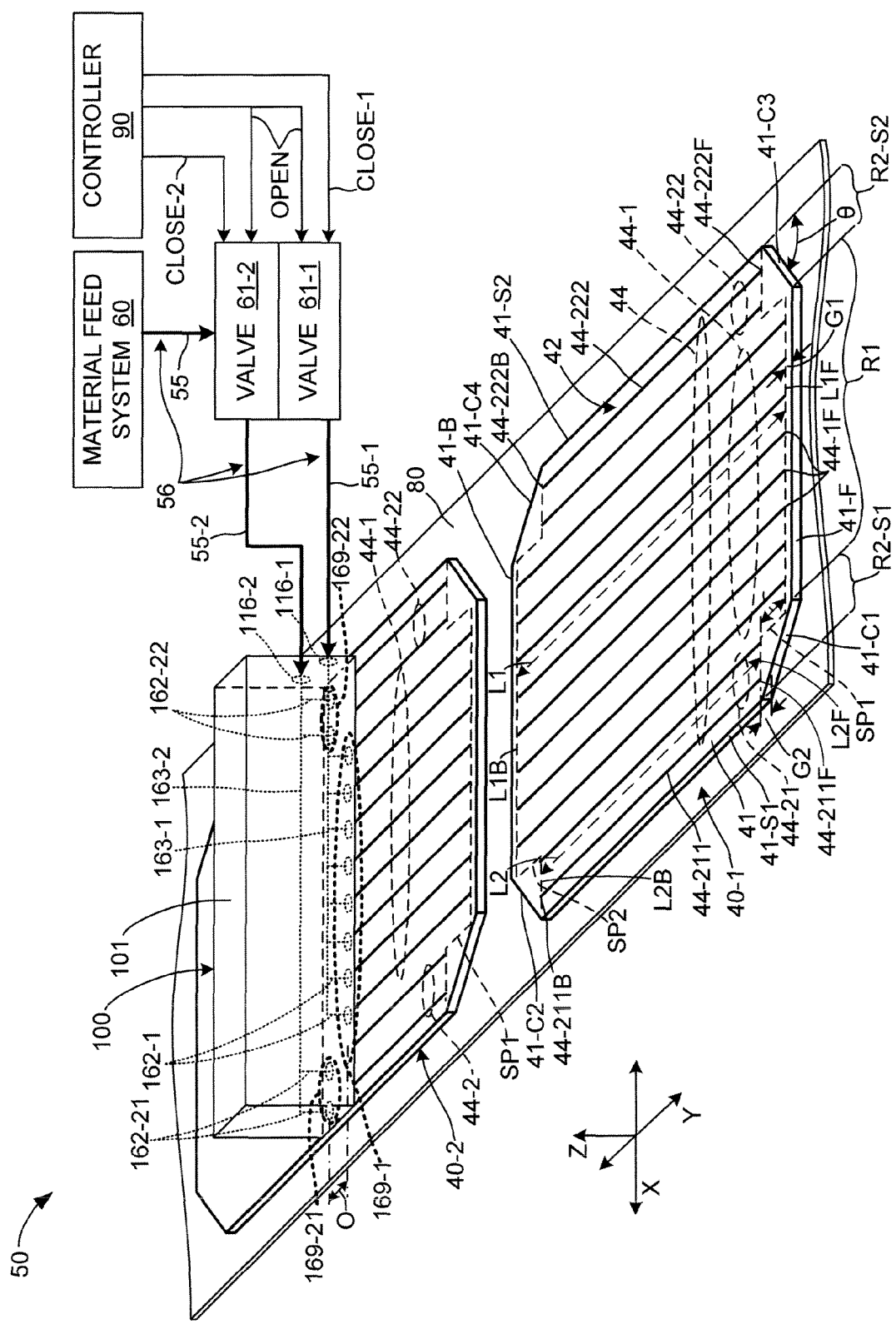
FIG. 1 is a perspective view showing a simplified micro-extrusion system and an H-pattern solar cell produced by the system in accordance with the present invention.

FIG. 1 is a perspective view showing two H-pattern solar cells 40-1 and 40-2 during a production process performed by a simplified micro-extrusion system 50 in accordance with the present invention. Specifically, micro-extrusion system 50 generally includes a printhead 100, a mechanism 80 for conveying semiconductor substrates 41 under printhead 100, valves 61-1 and 61-2 that open and close to supply a gridline material 55 from a material feed system 60 to printhead 100 by way of a supply flow path 56, and a controller 90 that controls the operating (opened/closed) state of valves 61-1 and 61-2 by way of control signals generated in accordance with the method described below.

As indicated in FIG. 1, conveyor 80 and printhead 100 are oriented such that gridlines 44 are parallel to each other and extend in a process direction on each substrate 41. As used herein, the phrase "process direction" refers to the direction in which substrates 41 are transported under printhead 100 by conveyor 80, and is indicated by the Y-axis in the figures. Printhead 100 is held by an X-Y-Z positioning mechanism (not shown) such that printhead 100 is aligned in a cross-process (X-axis) direction, which is both orthogonal to the process (Y-axis) direction and is in the plane defined by substrates 41. Printhead 100 is also maintained by the X-Y-Z positioning mechanism a predetermined vertical (Z-axis) position above upper surfaces 42 of substrates 41. Note that the relative printhead-to-wafer motion may be obtained by moving the printhead, the wafer, or both. By transporting substrates 41 under printhead 100 while selectively extruding gridline material 55 in the manner described below, parallel gridlines 44 are generated that extend in the process (Y-axis) direction on each substrate 41.

Referring to the lower portion of FIG. 1, substrate 41 of each H-pattern solar cells 40-1 and 40-2 is a "pseudo-square" mono-crystalline silicon substrate having a multi-sided (e.g., octagonal) peripheral edge. For purposes of description, a front edge 41-F and a back edge 41-B of each substrate 41 are oriented in the cross-process (X-axis) direction during the gridline printing process (i.e., such that gridlines 44 extend perpendicular to the front/back edges), and opposing side edges 41-S1 and 41-S2 extend in the process (Y-axis) direction during the gridline printing process (i.e., such that gridlines 44 extend parallel to the side edges). Substrate 41 also includes at least four chamfered edges (e.g., edges 41-C1, 41-C2, 41-C3 and 41-C4) that extend at an acute angle θ from an associated front, back and side edges (e.g., chamfered edge 41-C3 extends at about 45° between side edge 41-S2 and front edge 41-F).

Each H-pattern solar cell produced in accordance with the present invention is characterized in that gridlines 44 include a set of longer "central" gridlines 44-1 and two or more sets of shorter "side" gridlines 44-21 and 44-22, all having endpoints that are spaced from the peripheral edge of substrate 41. Longer central gridlines 44-1 are disposed in a central region R1 of substrate 41 that is defined between the substrate's front 41-F and back 41-B edges, and each longer central gridline 44-1 has a common length L1 that is defined between endpoints respectively disposed at predetermined gap distances G1 from a front edge 41-F and a back edge 41-B of substrate 41. The two sets 44-21 and 44-22 of shorter "side" gridlines are respectively disposed in side regions R2-S1 and R2-S2 of substrate 41, which are located on opposite sides of central region R1 and are defined between associated chamfered corners that are aligned in the process direction. For example, first shorter side gridline set 44-21 includes gridlines 44-211 and 44-212 extending between two associated chamfered edges 41-C1 and 41-C2 along side edge 41-S1, and second shorter gridline set 44-22 includes gridlines 44-221 and 44-222 extending between associated chamfered corners 41-C3 and 41-C4 along side edge 41-S2. Each shorter side gridline of sets 44-21 and 44-22 has a common length L2 that is shorter than length L1 by the distance set forth below. The common length of the shorter gridline sets 44-21 and 41-22 is set such that endpoints of the two outermost short gridlines (i.e., gridlines 44-211 and 44-222, which are respectively disposed closest to side edges 41-S1 and 41-S2) are offset from the adjacent chamfered edges by a predetermined distance. For example, endpoints 44-211F and 44-211B of outermost gridline 44-211 are respectively offset from adjacent chamfered edges 41-C1 and 41-C2 by a predetermined gap distance G2, and endpoints 44-222F and 44-222B of outermost gridline 44-222 are respectively offset from adjacent chamfered edges 41-C3 and 41-C4 by substantially the same distance.

In accordance with another aspect of the present invention, each solar cell 40-1 and 40-2 is also characterized in that the endpoints of longer "central" gridlines 44-1 and shorter "side" gridline sets 44-21 and 44-22 form predetermined "step" patterns SP1 and SP2 on substrate 41. That is, central gridlines 44-1 are printed such that their front endpoints 44-1F are substantially aligned to define a first line L1F, and the back endpoints of central gridlines 44-1 are substantially aligned to define a second line L1B, where both the first and second lines L1F and L1B are oriented in the cross-process (X-axis) direction. Similarly, the printing process is controlled such that the front and rear endpoints of the two sets of side gridlines 44-21 and 44-22 are substantially aligned in the cross-process X-axis direction. That is, the front endpoints of side gridlines 44-21 define a third line L2F that is substantially collinear with the front endpoints of side gridlines 44-22, and the back endpoints of side gridlines 44-21 define a fourth line L2B that is substantially collinear with the back endpoints of side gridlines 44-22. First line L1F is offset from third line L2F by a step distance S, whereby front endpoint lines L1F and L2F form a first step pattern SP1, which is shown by the dashed lines at the upstream ends of solar cells 40-1 and 40-2. A similar step distance separates second line L1B and fourth line L2B, whereby back endpoint lines L1B and L2B form a second step pattern SP2, which is also shown by the dashed line at the downstream end of solar cell 40-1.

Referring to the upper left portion of FIG. 1, printhead 100 includes a generally block-like body 101 that defines at least two input ports 116-1 and 116-2, at least three sets of nozzles 162-1, 162-21 and 162-22, and at least two flow distribution systems 163-1 and 163-2 that define flow passages from input ports 116-1 and 116-2 to nozzles 162-1, 162-21 and 162-22.

According to an aspect of the present invention, printhead 100 is constructed such that multiple nozzle outlet orifices defined at the end of nozzles 162-1, 162-21 and 162-22 are disposed in an offset arrangement that forms offset "step" pattern SP1 formed by the front endpoints of gridlines 44. First, (first) nozzles 162-1 are disposed in a central region of printhead 100, and (second) nozzles 162-21 and 162-22 are disposed on opposite sides of printhead 100 (i.e., nozzles 162-1 are located between nozzles 162-21 and 162-22 as measured in the cross-process direction). Each central nozzle 162-1 ends in an associated "central" (first) outlet orifice 169-1, and all of outlet orifices 169-1 are aligned in the cross-process (X-axis) direction and disposed adjacent to a front end of printhead body 101. Each side nozzle 162-21 ends in an associated "side" (second) outlet orifice 169-21, and each nozzle 162-22 ends in an associated "side" (second) outlet orifice 169-22, with outlet orifices 169-21 and 169-22 aligned in the cross-process (X-axis) direction and disposed adjacent to the rear end of printhead body 101. This offset arrangement is characterized by central outlet orifices 169-1 being offset in the process (Y-axis) direction from side outlet orifices 169-21 and 169-22 by an offset distance O designed to allow the printed step pattern (e.g. SP1) to have the desired step distance. Note that the spacing between adjacent orifices in the cross-process (X-axis) direction is the same as the desired spacing between gridlines 44, and that side outlet orifices 169-21 and 169-22 are disposed downstream (i.e., in the process Y-axis direction) from the "central" outlet orifices 169-1 by the predetermined offset distance O. Thus, the offset arrangement (pattern) formed by central outlet orifices 169-1 and side outlet orifices 169-21 and 169-22 is similar to step pattern SP1. As set forth in additional detail below, an advantage of providing a printhead 100 with the "central" and "side" orifices in this offset pattern is that gridline material flow through printhead 100 to all of orifices 169-1, 169-21 and 169-22 is initiated using a single "start" (valve open) signal. That is, with this arrangement, when gridline material 55-1 and 55-2 is simultaneously extruded through the outlet orifices 169-1 and side outlet orifices 169-21 and 169-22, the extruded gridline material inherently forms parallel gridlines 44 with start points having "step" pattern SP1.

According to another aspect of the present invention, flow distribution systems 163-1 and 163-2 are formed such that gridline material 55-1 entering printhead 100 through input port 116-1 is distributed by flow distribution system 163-1 to nozzles 162-1, and gridline material 55-2 entering printhead 100 through input port 116-2 is distributed by flow distribution system 163-2 to nozzles 162-21 and 162-22. That is, first input port 116-1 only communicates with (first) nozzles 162-1 by way of distribution system 163-1 such that gridline material 55-1 entering printhead 100 through input port 116-1 exits through one of central outlet orifices 169-1. Similarly, second input port 116-2 communicates with (second) nozzles 162-21 and 162-22 by way of distribution system 163-2 such that gridline material 55-2 entering printhead 100 through input port 116-2 exits through one of side outlet orifices 169-21 or 169-22. Separate flow distribution systems 163-1 and 163-2 facilitate the formation of backside step pattern SP2 in the manner set forth below.

FIGS. 2(A) and 2(B) show printhead 100 in additional detail. Referring to FIG. 2(A), in accordance with the illustrated simplified exemplary embodiment, central nozzles 162-1 (which are indicated by dashed vertical lines) include eight individual nozzle channels 162-11 to 162-18, side nozzles 162-21 include two nozzle channels 162-211 and 162-212, and side nozzles 162-22 include two nozzle channels 162-221 and 162-222. Each of nozzle channels 162-11 to 162-18 forms a flow passage between flow distribution system 163-1 and an associated output orifice 169-1 (e.g., nozzle channel 162-11 directs gridline material from flow distribution system 163-1 through outlet orifice 169-11, and nozzle channel 162-18 directs gridline material from flow distribution system 163-1 through outlet orifice 169-18). Similarly, nozzle channels 162-211 and 162-212 extend between flow distribution system 163-2 and outlet orifices 169-211 and 169-212, respectively, and nozzle channels 162-221 and 162-222 extend between flow distribution system 163-2 and outlet orifices 169-221 and 169-222, respectively. The number of nozzles in the exemplary embodiment is greatly reduced from practical applications for descriptive purposes.

According to an aspect of the present invention illustrated in FIG. 2(A), flow distribution systems 163-1 and 163-2 define a system of flow channels that distribute gridline material to each of the nozzles. First flow distribution system 163-1 includes an inlet passage 163-11 and a set of interconnected first branch passages 163-12 that communicate between inlet port 116-1 and nozzle channels 162-11 to 162-18 such that gridline material 55-1 entering first inlet port 116-1 is transmitted to each outlet orifices 169-1 by way of inlet passage 163-11 and a corresponding series of first branch passages 163-12. Similarly, second flow distribution system 163-2 includes an inlet passage 163-21 and a set of interconnected second branch passages 163-22 that communicate second inlet port 116-2 and nozzle channels 162-211, 162-212, 162-221 and 162-222 such that gridline material 55-2 entering inlet port 116-2 is transmitted to each outlet orifice 169-211, 169-222, 169-221 and 169-222 by way of inlet passage 163-12 and a corresponding series of second branch passages 163-22. In a preferred embodiment, branch passages 163-12 are formed as a substantially symmetrical series of flow paths such that a flow resistance (or conductance) from inlet port 116-1 to each central nozzle channel 169-11 to 169-18 is substantially equal (e.g., by way of causing the material to flow equal distances from the inlet ports to nozzle channels). Similarly, branch passages 163-22 are formed as a second substantially symmetrical series of flow paths such that the flow resistance/conductance from inlet port 116-2 to each side nozzle channel 169-211, 169-212, 169-221 and 169-222 is substantially equal. The advantage of providing symmetrical flow paths in this manner is that gridline material 55-1 is conveyed through printhead 100 to each outlet orifice 169-11 to 169-18 with substantially the same flow pressure, and gridline material 55-2 is conveyed through printhead 100 to each outlet orifice 169-211, 169-212, 169-221 and 169-222 with substantially the same flow pressure.

FIG. 2(B) is a bottom view of printhead 100 showing the offset arrangement of outlet orifices in additional detail. First outlet orifices 169-11 to 169-18 (collectively referred to herein as outlet orifices 169-1) are aligned in the cross-process (X-axis) direction to define a first orifice line X1, and are disposed in a central region XC1 of printhead 100. Similarly, second outlet orifices 169-211, 169-212, 169-221 and 69-2, 22 are aligned to collectively define a second orifice line X2 that extends in the cross-process direction, with outlet orifices 169-211 and 169-212 disposed in a first cross-process side region X2-S1, and outlet orifices 169-221 and 169-222 disposed in a second cross-process side region X2-S2. As indicated in FIG. 2(B), first orifice line X1 is spaced from second orifice line X2 by offset distance O in the process (Y-axis) direction, and central region X1 is entirely disposed between side regions X2-S1 and X2-S2 in the cross-process (X-axis) direction.

Referring again to FIG. 1, in addition to printhead 100 and conveyor 80, micro-extrusion system 50 includes two valves 61-1 and 61-2 that are disposed in supply flow path 56 and used to control the flow of gridline material 55 from a material feed system (source) 60 to printhead 100, and a controller 90 that is configured using known techniques to individually control the operating (opened/closed) state of two valves 61-1 and 61-2 in the manner described below to generate gridlines 44 having offset patterns SP1 and SP2. Valve 61-1 is connected between source 60 and inlet port 116-1, and is controlled as set forth below to supply a first portion 55-1 of gridline material 55 into printhead 100 for distribution to central outlet orifices 169-1. Valve 61-2 is connected between source 60 and inlet port 116-2, and is controlled as set forth below to supply a second portion 55-2 of gridline material 55 into printhead 100 for distribution to side outlet orifices 169-21 and 169-22. Controller 90 generates and transmits control signals "OPEN", "CLOSE-1" and "CLOSE-2" to valves 61-1 and 61-2 in the manner described below with reference to FIGS. 3(A) to 3(D) to facilitate the desired gridline printing process.

FIGS. 3(A) to 3(D) are simplified diagrams depicting the formation of gridlines on a substrate 41 by system 50 in accordance with an exemplary embodiment of the present invention. In these figures printhead 100 is illustrated using dashed "hidden" lines in order to show the orientation of the outlet orifices during the printing process. As set forth above with reference to FIG. 1, printhead 100 and target substrates 41 are disposed using known techniques such that target substrates 41 passes under printhead 100 at a constant rate during the printing process, for example, by way of conveyor belt 80 (shown in FIG. 1).

Figure 3A:
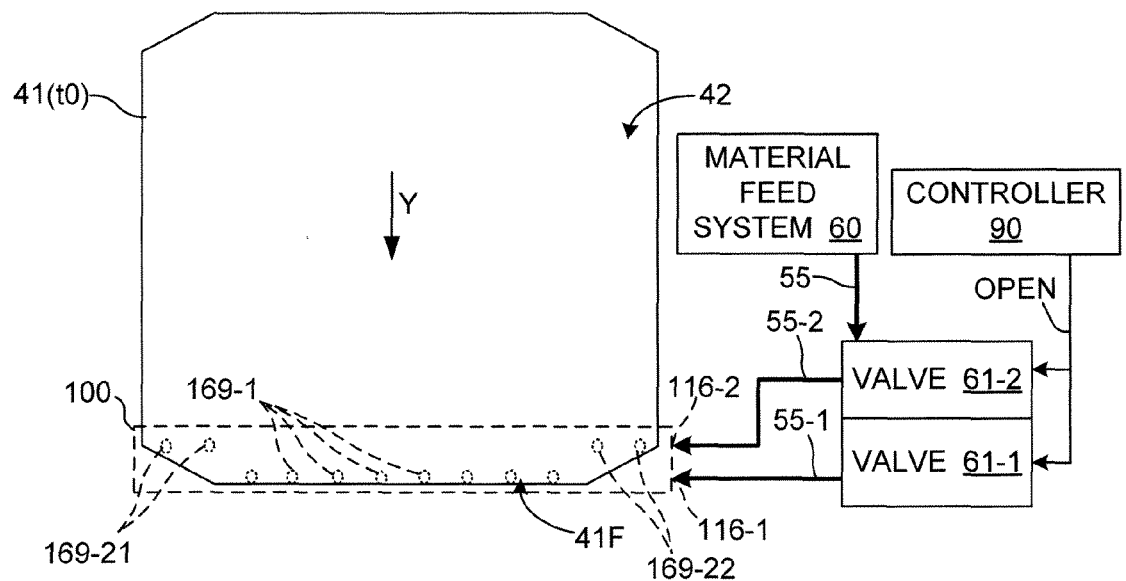
FIGS. 3(A), 3(B), 3(C) and 3(D) are simplified top views showing a portion of the micro-extrusion system of FIG. 1 during a gridline printing operation according to another embodiment of the present invention.

FIG. 3(A) shows a target substrate 41(t0) (i.e., target substrate 41 at an initial time t0 while target substrate 41 is moving in the process (Y-axis) direction under printhead 100 and has reached a predetermined print start-point position relative to printhead 100 (i.e., with front edge 41-F disposed under central outlet orifices 169-1). At time t0 controller 90 transmits a (first) valve "OPEN" command to both valves 61-1 and 61-2 such that the operating state of both valves 61-1 and 61-2 changes from closed to open. Opening both valves 61-1 and 61-2 simultaneously causes the flow of gridline material portions 55-1 and 55-2 into printhead 100 through inlet ports 116-1 and 116-2 to begin simultaneously, which in turn causes simultaneously extrusion of gridline material from both central outlet orifices 169-1 and side outlet orifices 169-21 and 169-22 onto upper surface 42.

Figure 3B:
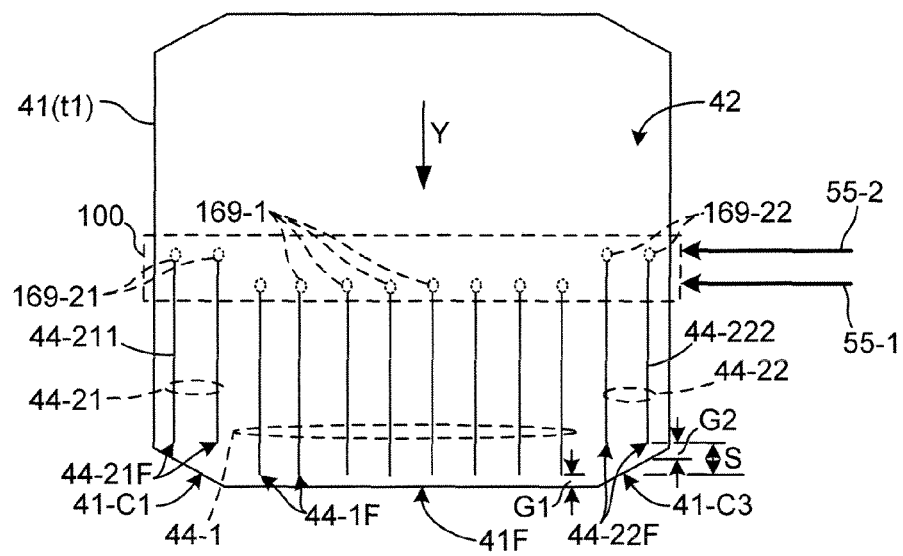
Figure 4:
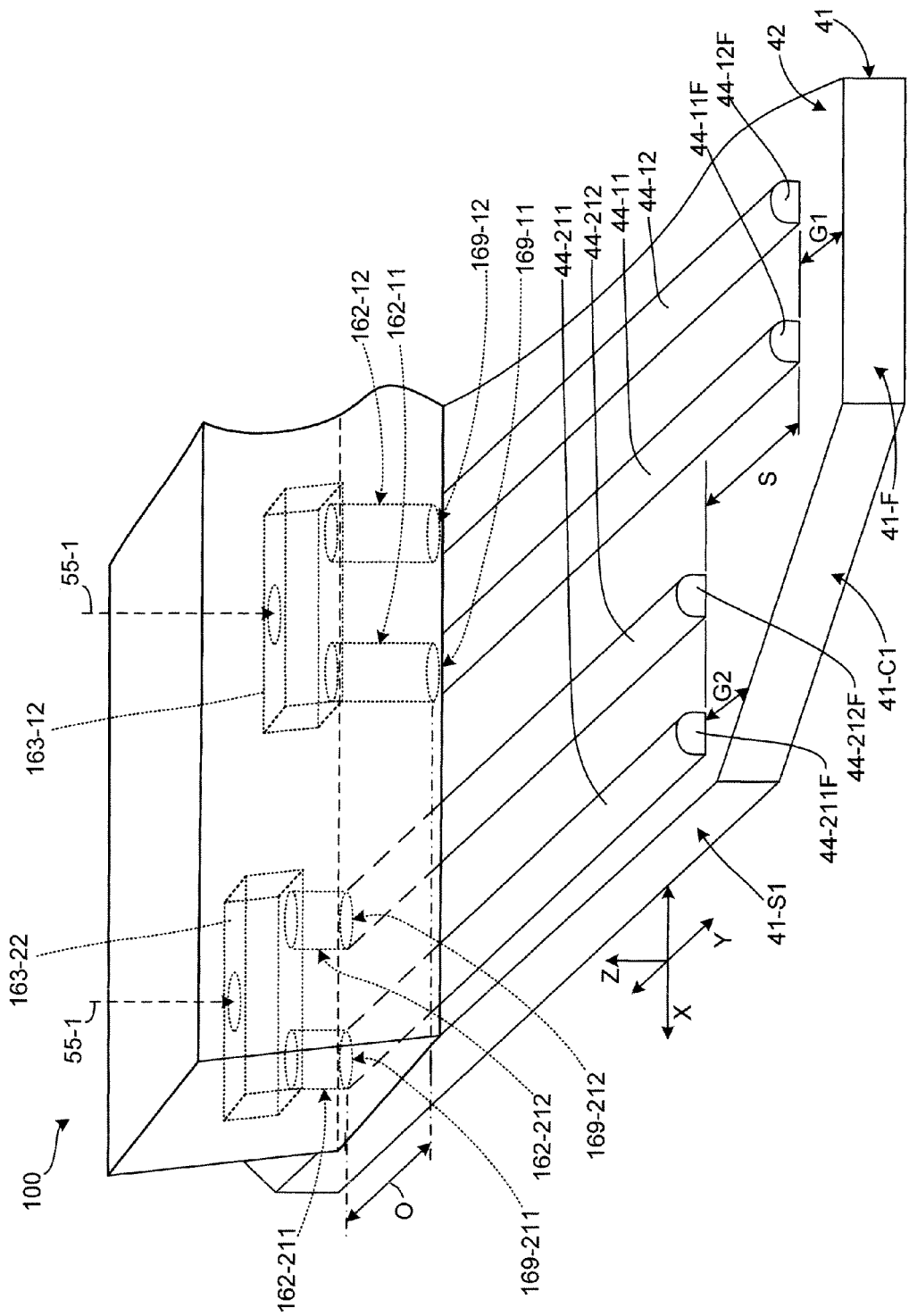
FIG. 4 is a simplified partial perspective view showing a portion of the simplified printhead assembly of FIG. 2(A) during the gridline printing operation of FIG. 3(B)

FIG. 3(B) and FIG. 4 show target substrate 41(t1) shortly after initializing gridline material flow, and shows portions of gridlines 44-1, 44-21 and 44-22 that are printed onto upper surface 42 at time t1. As indicated in these figures, because central outlet orifices 169-1 are aligned in the cross-process direction, the simultaneous extrusion of gridline material from central outlet orifices 169-1 causes the front edges 44-1F of central gridlines 44-1 to be aligned and spaced from front edge 41F by the required gap distance G1 (i.e., as shown in FIG. 4, front edges 41-11F and 41-12F of gridlines 41-11 and 41-12 are spaced from front edge 41-F by gap distance G1). Similarly, because side outlet orifices 169-21 and 169-22 are aligned in the cross-process direction, the simultaneous extrusion of gridline material from side outlet orifices 169-21 and 169-22 creates side gridlines 44-21 and 44-22 with respective front edges that are aligned in the cross-process direction, with the front edges of outermost side gridlines 44-211 and 44-222 respectively spaced from chamfered edges 41-C1 and 41-C3 by the required gap distance G2 (e.g., as shown in FIG. 4, front edges 41-211F of outermost gridline 41-211 is spaced from chamfered edge 41-C1 by gap distance G2, and front edge 41-212F of adjacent gridline 41-212 is aligned with front edge 41-211F in the cross-process direction). Further, because central outlet orifices 169-1 and side outlet orifices 169-21 and 169-22 are disposed in the offset arrangement mentioned above (e.g., as shown in FIG. 4, side outlet orifices 169-211 and 169-212 are offset by distance O from central outlet orifices 169-11 and 169-12), the simultaneous extrusion of gridline material from both sets of orifices generates gridlines 44-1, 44-21 and 44-22 with the desired "step" pattern (i.e., with the front edges 44-11F and 44-12F of gridlines 44-11 and 44-22 offset from front edges 44-211F and 44-212F of gridlines 44-211 and 44-212 by the desired step distance S, as shown in FIG. 4).

Figure 3C:
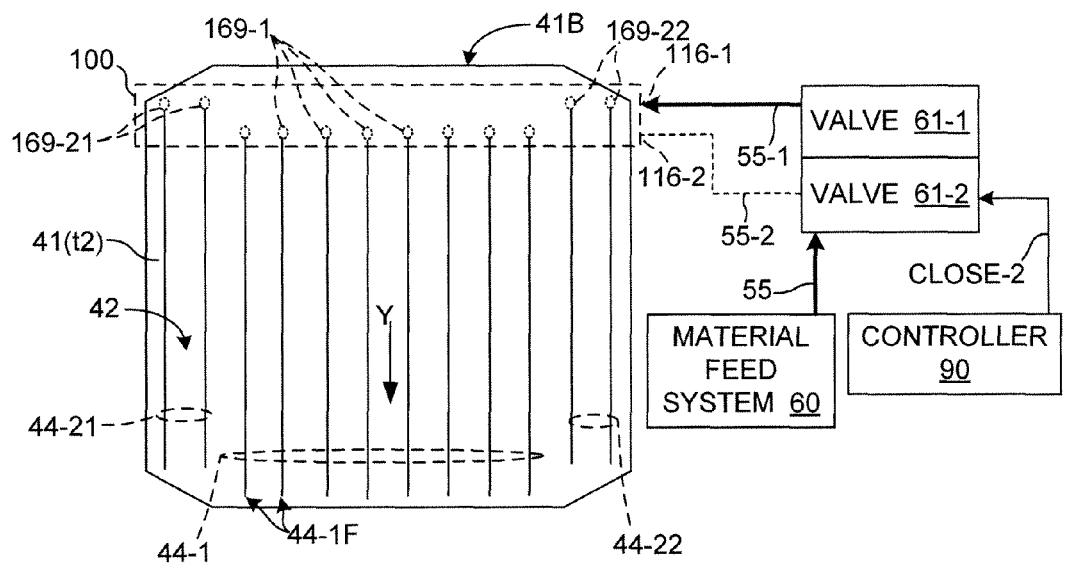

FIG. 3(C) shows target substrate 41(t2) when target substrate 41 has almost entirely passed under printhead 100 and has reached a predetermined point corresponding to the back endpoint of shorter gridlines 44-21 and 44-22. At time t2 controller 90 transmits valve close signal "CLOSE-2" (shown in FIG. 1), whereby valve 61-2 closes to terminate the flow of gridline material 55-2 through input port 116-2 into printhead 100, which in turn terminates the extrusion of gridline material from side orifices 169-21 and 169-22, thus forming rear endpoints 44-21B and 44-22B (shown in FIG. 3(D)) for side gridlines 44-21 and 44-22. Specifically, the flow of gridline material through side orifices 169-21 and 169-22 is simultaneously terminated and such that back endpoints 44-21B and 44-22B of the side gridline structures 44-21 and 44-22 are aligned parallel to the cross-process X-axis direction, and are entirely disposed inside the peripheral edge of target substrate 41. Note that valve 61-1 remains in the open operating state at time t2 such that gridline material 55-1 continues to flow through input port 116-1 and printhead 100 to central orifices 169-1.

Figure 3D:
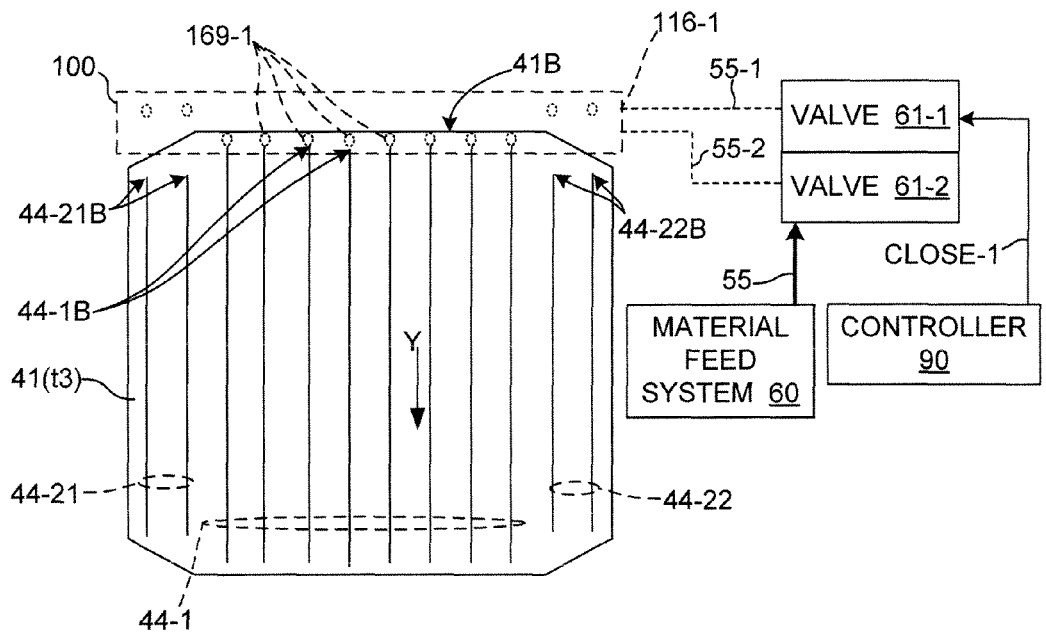

FIG. 3(D) shows target substrate 41(t3) when target substrate 41 has reached the end of the print operation (i.e., when central orifices 169-1 are positioned at the required gap distance from back edge 41B of target substrate 41). At this point controller 90 sends a second close command CLOSE-1 to the first valve 61-1 (shown in FIG. 1), thereby terminating the flow of gridline material 55-1 from valve 61-1 through input port 116-1 into printhead 100, which in turn terminates the extrusion of gridline material through the central nozzle orifices 169-1. The termination of gridline material 55-1 produces back endpoints 44-1B of central gridline structures 44-1 that are aligned parallel to the cross-process (X-axis) direction and are spaced from back edge 41B by a predetermined gap distance.

The printing operation described above with reference to FIGS. 3(A) to 3(D) provides several advantages over conventional printing methods. First, this approach provides a simple method for producing H-pattern solar cells on octagonal mono-crystalline substrates in a significantly less expensive and more reliable and repeatable manner than is possible using conventional extrusion/masking or screen-printing methods, thereby facilitating the production of higher quality mono-crystalline-based H-pattern contact solar cells at a cost that is comparable to solar cells formed on square/rectangular poly-crystalline silicon wafers. In addition, the printing method and associated hardware can be implemented on existing gridline printing systems with minimal modifications, thus allowing the production of higher efficiency H-pattern solar cells on mono-crystalline silicon wafers without requiring large retooling costs.

Additional features of the novel printhead described above will now be described with reference to several specific embodiments.

Figure 5:
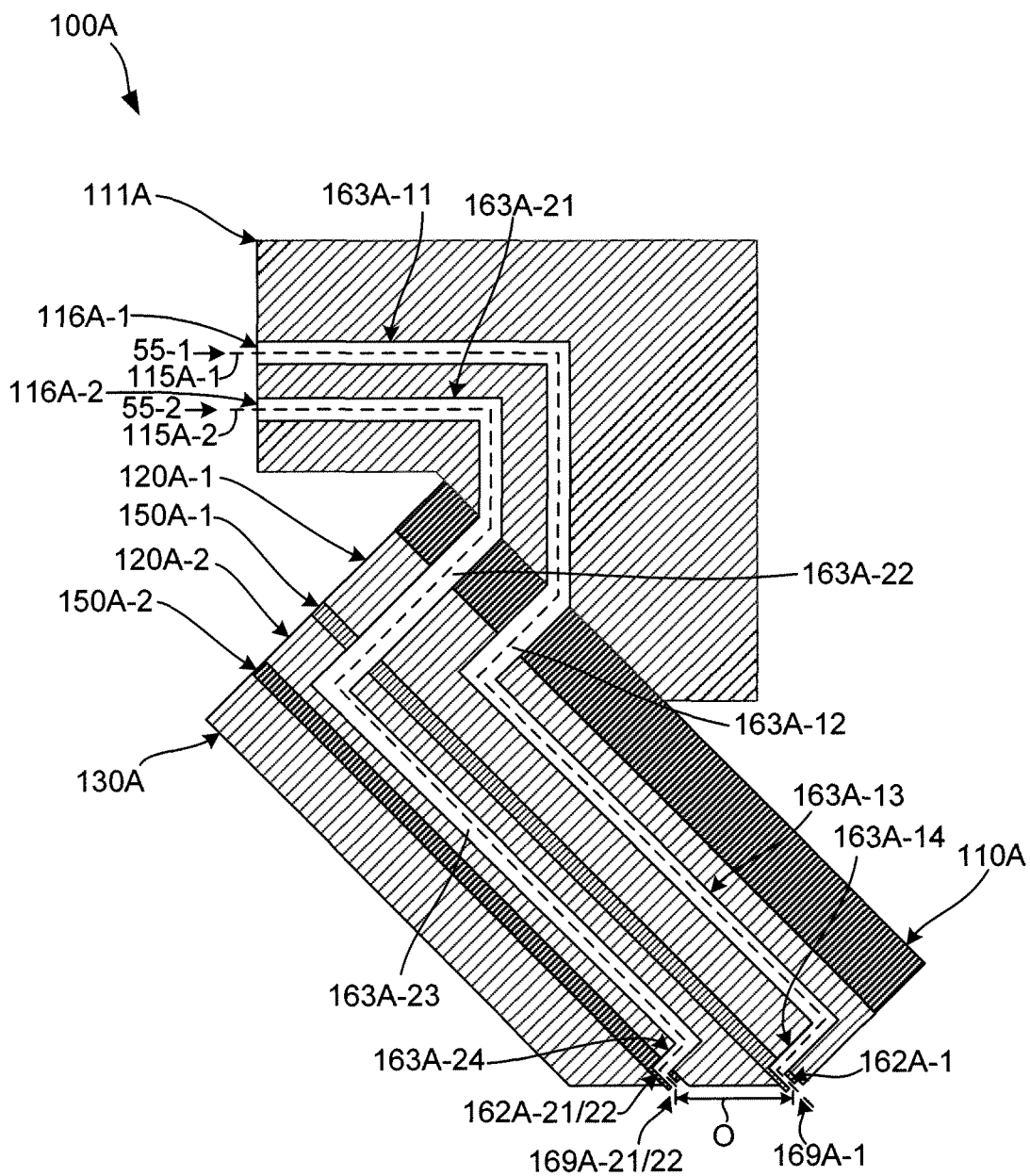
FIG. 5 is a simplified side view showing a multi-layer micro-extrusion printhead assembly in accordance with a specific embodiment of the present invention.

FIG. 5 is a cross-sectional side view showing a multi-layer printhead assembly 100A according to a first specific embodiment of the present invention. Printhead assembly 100A includes an optional back piece 111A that serves as a block for attaching supply lines to inlet ports 116A-1 and 116A-2, for transmitting gridline material 55-1 and 55-2 through flow passages 163A-11 and 163A-21 into printhead assembly 100A, and for maintaining printhead assembly 100A in a proper orientation during gridline printing operations. Other than providing additional feedline attachment points and associated flow paths, back piece 111A is functionally analogous to back piece structures utilized in conventional micro-extrusion systems.

Multi-layer printhead assembly 100A is similar to printhead 100 (discussed above) in that printhead assembly 100A includes a row of central nozzles 162A-1 that define central outlet orifices 169A-1 (shown in end view), and two sets of side nozzles 162A-21 and 162A-22 that respectively define side outlet orifices 169A-21 and 169A-22, where central outlet orifices 169A-1 are offset from side outlet orifices 169A-21 and 169A-22 by a predetermined offset distance O. That is, in a manner substantially identical to that shown in FIG. 1, outlet orifices 169A-1 are disposed in a central cross-process region of printhead assembly 100A, and each of outlet orifice sets 169A-21 and 169A-22 includes at least two outlet orifices disposed in side regions that are separated in the cross-process direction by the central cross-process region and located downstream from outlet orifices 169A-1 in the process direction by offset distance O, whereby gridline material simultaneously extruded through outlet orifices 169A-1 and 169A-21/22 generates gridlines in a step pattern on a target substrate.

Multi-layer printhead assembly 100A differs from printhead 100 in that printhead assembly 100A is made up of several layer-like structures that are bolted or otherwise fastened together in a stacked arrangement to form a unified structure and held by back piece 111A. Specifically, printhead assembly 100A includes an upper plate 110A, a first plenum layer 120A-1, a first nozzle layer 150A-1, a second plenum layer 120A-2, a second nozzle layer 150A-2, and a lower plate 130A. As indicated by the dashed-lined pathways shown in FIG. 5, each of the layers is constructed such that flow pathways 115A-1 and 115A-2 are provided for gridline material 55-1 and 55-2 that extend from inlet ports 116A-1 and 116A-2 through each of the layers to outlet nozzles 169A-1 and 169A-21/22. Note that the positions, pathway directions and pathway sizes of inlet ports 116A-1 and 116A-2 and flow pathways 115A-1 and 115A-2 are altered in FIG. 5 for descriptive purposes.

Upper plate 110A and lower plate 130A are rigid structures that serve to rigidly clamp nozzle layers and plenum layers together during the printing process. Upper plate 110A also includes portions of vertical (second) flow channel regions 163A-12 and 163A-22 that communicate between back piece 111A and first plenum 120A-1. As indicated in FIG. 5, nozzle layers 150A-1 and 150A-2 and plenums 120A-1 and 120A-2 are arranged between upper (first) plate 110A lower (second) plate 130A such that upper plate 110A contacts plenum structure 120A-1 and lower plate 130A contacts nozzle layer 150A-2. Both plates 110A and 130A are machined (or otherwise formed) from blocks of a suitable metal (or other rigid material) using known techniques.

Nozzle layers 150A-1 and 150A-2 are separate (spaced apart) structures that are fixedly maintained at a distance from each other that is determined by a thickness of first plenum 120A-1 (and any other spacing "shim" layers that might be used). Nozzle layer 150A-1 is formed to include a set of central (first) outlet orifices 169A-1, and second nozzle layer 150A-2 is formed to include two sets of side (second) outlet orifices 169A-21 and 169A-22 (collectively shown in end view in FIG. 5 and identified as 169A-21/22). The distance maintained between nozzle layers 150A-1 and 150A-2 is selected such that central nozzle outlet orifices 169A-1 are separated from side nozzle outlet orifices 169A-21/22 by offset distance O. An advantage provided by constructing nozzle layers 150A-1 and 150A-2 as separate structures is that adjustment of the offset distance O is facilitated, for example, by way of adding or subtracting spacing layers (shims) disposed between nozzle layers 150A-1 and 150A-2. In accordance with an embodiment of the present invention, each of nozzle layers 150A-1 and 150A-2 are made up of stacked metal or polymer plates in accordance with established methods and designs (e.g., in a manner similar to that described below with reference to FIGS. 11 and 12). An advantage to constructing nozzle layers 150A-1 and 150A-2 using established nozzle layer production methods and designs is that this approach minimizes design and production costs by avoiding the need to produce entirely new nozzle structures. That is, other than the number of nozzle layers (i.e., two instead of one) and the number and position of nozzles provided on each nozzle layer 150A-1 and 150A-2 differs from conventional printheads, the individual nozzles provided on nozzle layers 150A-1 and 150A-2 can be essentially identical to those of conventional printheads. Because existing nozzle design and production methods are utilized to generate nozzles 162A-1, 162A-21 and 162A-22, nozzle performance (i.e., the gridline forming characteristics) of printhead assembly 100A is reliably essentially identical to that of convention single-layer micro-extrusion printheads. Yet another possible advantage to generating nozzle layers 150A-1 and 150A-2 using existing nozzle designs and production methods is that micro-extrusion printhead assembly 100A has a size that is comparable to conventional micro-extrusion printheads utilized in the production of H-pattern solar cells on poly-silicon wafers, which in turn facilitates the use of printhead assembly 100A in existing micro-extrusion systems with minimal modification.

In accordance with another aspect of the present embodiment, the various layers of printhead assembly 100A define separate flow distribution channels that distribute gridline material between inlet ports 116A-1 and 116A-2 and nozzles 162A-1 and 162A-21/22. That is, a first flow distribution channel 163A-1 communicates between inlet port 116A-1 and nozzles 162A-1, and includes first flow region 163A-11, vertical flow channel region 163A-12, branching flow channels 163A-13 that extends along plenum 120A-1, and (first) plenum outlets 163A-14 that extend downward from plenum 120A-1 to nozzles 162A-1. Similarly, a second flow distribution channel 163A-2 communicates between inlet port 116A-2 and nozzles 162A-21/22, and includes first flow region 163A-21, vertical flow channel region 163A-22, branching flow channels 163A-23 that extends along plenum 120A-2, and (second) plenum outlets 163A-24 that extend downward from plenum 120A-2 to nozzles 162A-21/22. The use of vertical flow distribution channel 163A-22 that passes through plenum 120A-1 and nozzle layer 150A-1 to pass gridline material to plenum 120A-2 and nozzle layer 150A-2 facilitates the use of printhead assembly 100A with minimal modification to the existing micro-extrusion system. The use of separate plenums 120A-1 and 120A-2 for each flow layer simplifies the design of flow distribution systems 163A-1 and 163A-2 by allowing each flow distribution system 163A-1/2 to be formed on a separate plenum structure using methods utilized by conventional micro-extrusion printheads.

FIGS. 6(A) and 6(B) show portions of flow distribution channels 163A-1 and 163A-2 that are defined in plenums 120A-1 and 120A-2, respectively. FIG. 6(A) shows plenum 120A-1, which defined a lower portion of first flow region (first plenum inlet) 163A-12, branching flow channels 163A-13, and upper portions of first plenum outlets 163A-14. FIG. 6(B) shows plenum 120A-2, which defined a lower portion of first flow region (second plenum inlet) 163A-22, branching flow channels 163A-23, and upper portions of second plenum outlets 163A-24. According to an embodiment of the present invention shown in FIGS. 6(A) and 6(B), plenums 120A-1 and 120A-2 are constructed by machining or otherwise shaping a metal or hard plastic material (e.g., Techtron®) such that a flow distance traveled from inlet ports 116A-1 and 116A-2 to associated nozzles 162A-1 and 162A-21/22 is substantially equal. Specifically, branching flow channels 163A-13 of plenum 120A-1 are formed as a substantially symmetrical series of flow paths such that gridline material entering plenum 120A-1 through first plenum inlet 163A-12 travels substantially the same distance along a corresponding branch of branching flow channels 163A-13 to any of first plenum outlets 163A-14. Similarly, branching flow channels 163A-23 of plenum 120A-2 are formed as a substantially symmetrical series of flow paths such that gridline material entering plenum 120A-2 through second plenum inlet 163A-22 travels substantially the same distance along a corresponding branch of branching flow channels 163A-23 to any of second plenum outlets 163A-24. The use of symmetrical flow distribution channels 163A-1 and 163A-2 facilitates the generation of uniform extrusion pressure at each nozzle 169A-1 and 169A-21/22.

Figure 7:
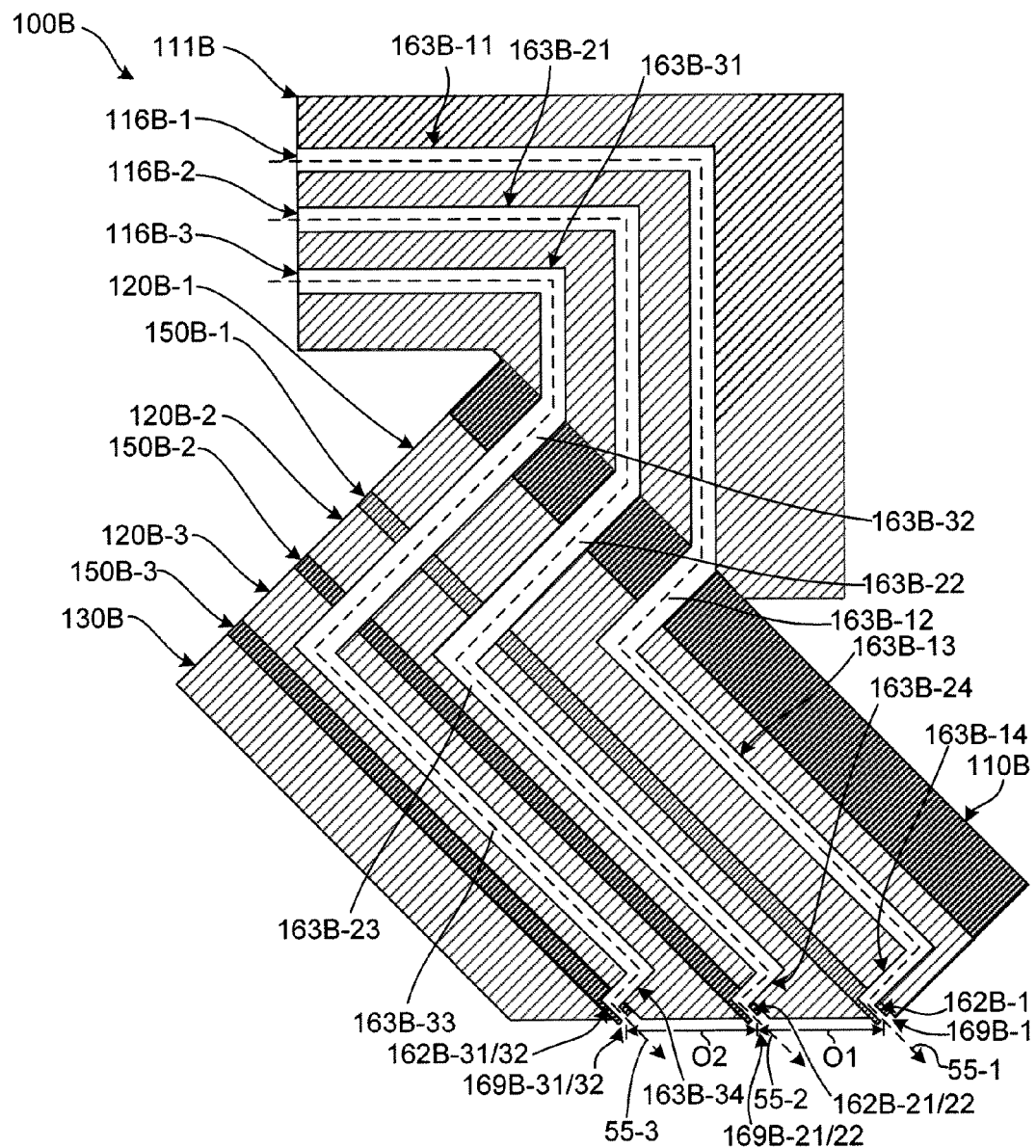
FIG. 7 is a simplified side view showing a multi-layer micro-extrusion printhead assembly for generating a two-step gridline pattern in accordance with another specific embodiment of the present invention.
Figure 8:
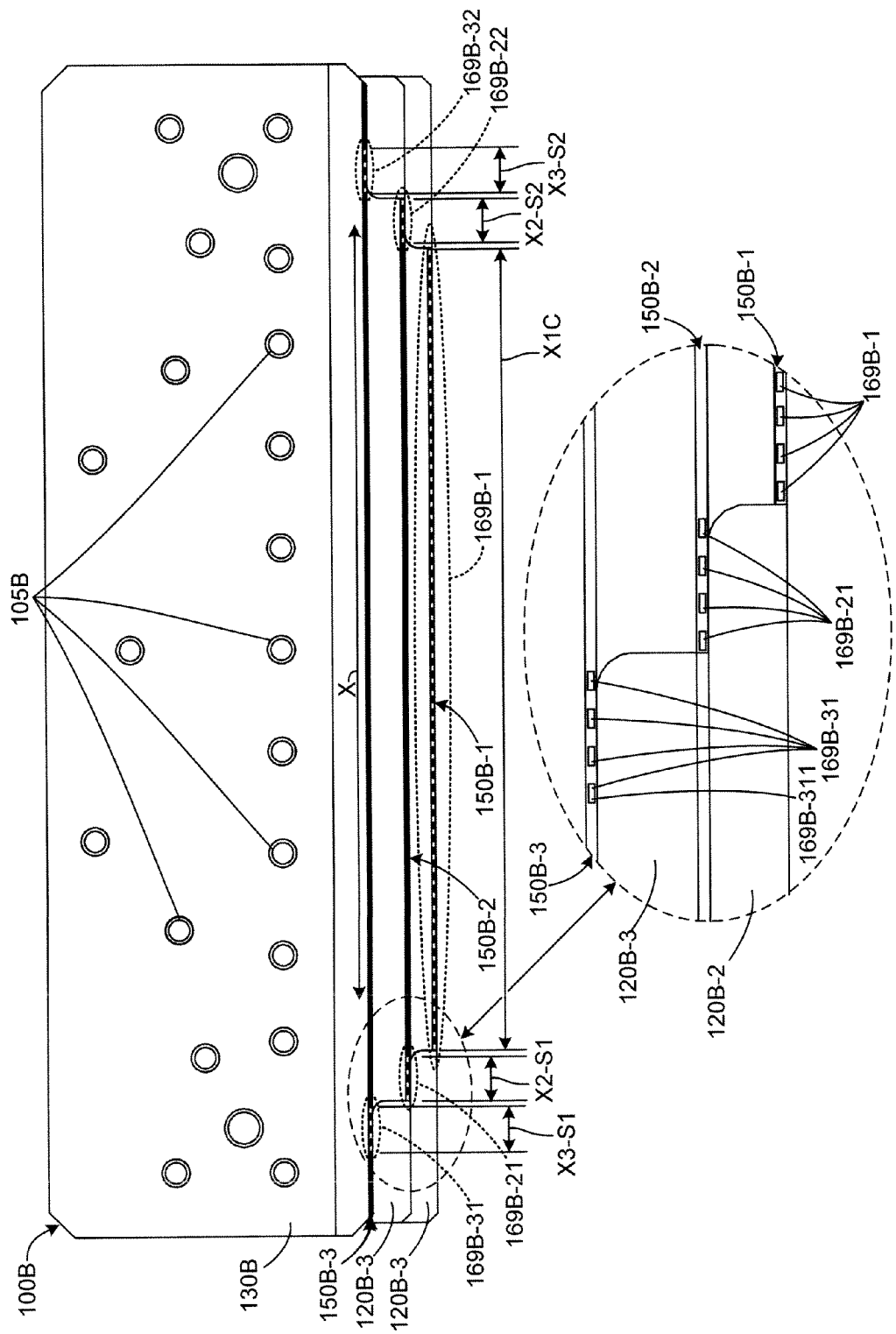
FIG. 8 is a rear bottom view of the micro-extrusion printhead assembly of FIG. 7.

FIGS. 7 and 8 show a multi-layer printhead assembly 100B for generating a "two step" gridline pattern according to a second specific embodiment of the present invention, where FIG. 7 is a cross-sectional side view of printhead assembly 100B, and FIG. 8 is a front view of printhead assembly 100B.

Referring to FIG. 7, printhead assembly 100B is similar to printhead assembly 100A in that it includes an optional back piece 111B that functions in the manner described above with reference to back piece 111A, and several layer-like structures that are bolted or otherwise fastened together in a stacked arrangement to form a layered structure that is held by back piece 111B. In addition, multi-layer printhead assembly 100B includes an upper plate 110B, a first plenum layer 120B-1, a first nozzle layer 150B-1, a second plenum layer 120B-2, a second nozzle layer 150B-2, and a lower plate 130B, where first nozzle layer 150B-1 includes a row of central nozzles 162B-1 that define central outlet orifices 169B-1 (shown in end view), and nozzle layer 150B-2 includes two sets of side nozzles 162B-21 and 162B-22 that respectively define side outlet orifices 169B-21 and 169B-22, where central outlet orifices 169B-1 are offset from side outlet orifices 169B-21 and 169B-22 by a predetermined offset distance O1. In addition, printhead assembly 100B defines a first flow distribution channel 163B-1 that communicates between inlet port 116B-1 and nozzles 162B-1, and includes first flow region 163B-11, vertical flow channel region 163B-12, branching flow channels 163B-13 that extends along plenum 120B-1, and (first) plenum outlets 163B-14 that extend downward from plenum 120B-1 to nozzles 162B-1. Similarly, a second flow distribution channel 163B-2 that communicates between inlet port 116B-2 and nozzles 162B-21/22, and includes first flow region 163B-21, vertical flow channel region 163B-22, branching flow channels 163B-23 that extends along plenum 120B-2, and (third) plenum outlets 163B-34 that extend downward from plenum 120B-3 to nozzle channels 162B-31/32. Branching flow channel 163B-33, which is defined in plenum 120B-3, respectively, are constructed as described above with reference to FIGS. 6(A) and 6(B), respectively, such that a flow distance traveled from inlet ports 116B-1 and 116B-2 to associated nozzles 162B-1 and 162B-21/22 are substantially equal. The features and benefits described above with reference to printhead assembly 100A thus apply to printhead assembly 100B.

Multi-layer printhead assembly 100B differs from printhead assembly 100A in that printhead assembly 100B includes two additional (third) sets of "side" nozzle channels 162B-31 and 162B-32 (collectively 162B-31/32) that define two additional (third) sets of "side" outlet orifices 169B-31 and 169B-32 (collectively 169B-31/32), and a (third) flow distribution channel 163B-3 that communicates between a (third) inlet port 116B-3 and nozzles 162B-31/32. As indicated in FIG. 7, nozzle channels 162B-31/32 are disposed in a (third) nozzle layer 150B-3 that communicates with flow distribution channel 163B-3 by way of a (third) plenum layer 120B-3, whereby nozzle layer 150B-3 is positioned downstream from nozzle layer 150B-2 such that outlet orifices 169B-31/32 are offset in the process (Y-axis) direction from outlet orifices 169B-21/22 by a second offset distance O2, which in one embodiment is substantially equal to offset distance O1. That is, outlet orifices 169B-31/32 are offset in the process (Y-axis) direction from central outlet orifices 169B-1 by a distance equal to a sum of offset distances O1 and O2. Nozzle layers 150B-1, 150B-2 and 150B-3 are disposed in a stacked arrangement with plenum structure 120B-2 sandwiched between nozzle layer 150B-1 and nozzle layer 150B-2, and plenum structure 120B-3 sandwiched between nozzle layers 150B-2 and 150B-3, with the nozzle/plenum stack being sandwiched between upper plate 110B and lower plate 130B. Similar to flow distribution channels 163B-1 and 163B-2, flow distribution channel 163B-3 includes a first flow region 163B-31 defined in back piece 111B, vertical flow channel region 163B-23, branching flow channels 163B-33 that extends along plenum layer 120B-3, and (second) plenum outlets 163B-24 that extend downward from plenum 120B-2 to nozzles 162B-21/22. Vertical (second) flow passage portion 163B-32 is collectively defined by upper plate 110B, plenums 120B-1 and 120B-2 and nozzle layers 150B-1 and 150B-2, and communicates at its lower end (third plenum inlet) with a first end of branching flow channels 163B-33 (i.e., such that gridline material 55-3 passes through nozzle layers 150B-1 and 150B-2 and plenum structures 120B-1 and 120B-2 between inlet port 116B-3 and plenum structure 120B-3). Branching flow channels 163B-33, which are defined in plenum 120B-3, are constructed substantially as described above with reference to FIG. 6(B) (i.e., such that a flow distance traveled from inlet port 116B-3 to each nozzle channel 169B-31/32 is substantially equal).

Referring to FIG. 8, printhead assembly 100B includes sixty-four "center" orifices 169B-1 disposed in central cross-process region X1C, four inner side orifices 169B-21 disposed in a (first) cross-process side region X2-S1, and four inner side orifices 169B-21 disposed in a (second) cross-process side region X2-S2. Similar to "center" orifices 169B-1 and "side" orifices 169B-21/22, outlet orifices 169B-31/32 are aligned in the cross-process (X-axis) direction, with four outlet orifices 169B-31 disposed in a (third) cross-process side region X3-S1 and four outlet orifices 169B-32 disposed in a (fourth) cross-process side region X3-S2, the third and fourth cross-process side regions X3-S1 and X3-S2 being separated in the cross-process X-axis direction by central cross-process region X1C and cross-process side regions X2-S1 and X2-S2. As described below with reference to FIGS. 9(A) to 9(D), with this arrangement, gridline material simultaneously extruded through central outlet orifices 169B-1, inner side outlet orifices 169B-21/22, and outer side outlet orifices 169B-31/32 generates gridlines whose starting endpoints form a "two-step" pattern.

According to another embodiment of the present invention, plenum structures 120B-1 to 120B-3 are constructed by machining or otherwise shaping one or more of a hard plastic material (e.g., Techtron®) or a metal plate material (e.g., steel, aluminum, or steel alloy). In a presently preferred embodiment, at least one of the plenum structures is formed from plastic, and one or more of the plenum structures is formed from metal (e.g., plenum structure 120B-1 is formed from Techtron®, and plenum structures 120B-2 and 120B-3 are formed using steel). The inventors found that the three-nozzle stack arrangement of printhead assembly 100B can experience separation of the layers and distortion of the nozzle channels during extrusion, and have found that the use of a metal central plenum improves performance by resisting such separation and distortion when bolted together using the pattern of mounting bolts 150B shown in FIG. 8.

FIGS. 9(A) to 9(D) are simplified diagrams depicting the formation of gridlines in a "two-step" pattern on a substrate 41 utilizing an associated micro-extrusion system 50B including printhead assembly 100B in accordance with another embodiment of the present invention. System 50B, which is only partially shown, is essentially the same as system 50 (described above), but includes three valves 61B-1, 61B-2 and 61B-3 (instead of two), and controller 90B is modified to control the three valves as set forth below in order to produce "two-step" gridline endpoint patterns. Printhead 100B and target substrates 41 are otherwise disposed such that target substrates 41 passes under printhead 100B using the methods mentioned above.

Figure 9A:
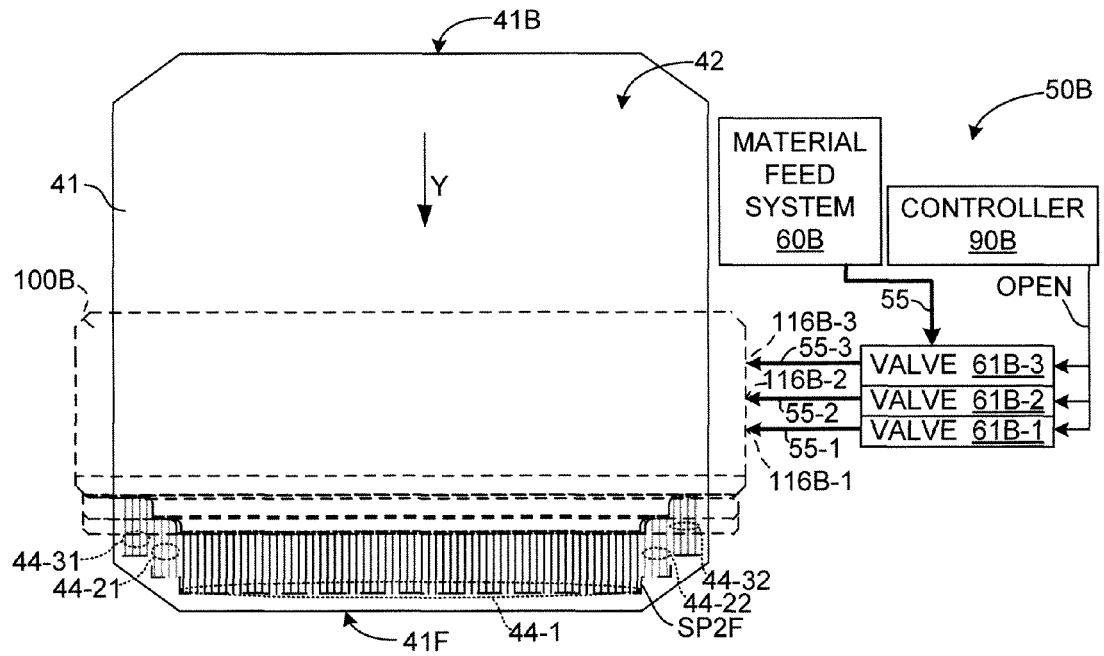
FIGS. 9(A), 9(B), 9(C) and 9(D) are simplified top views showing a portion of a micro-extrusion system during a gridline printing operation utilizing the multi-layer micro-extrusion printhead assembly of FIG. 7 according to another embodiment of the present invention.

FIG. 9(A) shows a target substrate 41 after reaching a predetermined print start-point position relative to printhead 100B, and after controller 90 has simultaneously transmitted a (first) valve "OPEN" command to valves 61B-1, 61B-2 and 61B-3 such that the operating state of all three valves 61B-1, 61B-2 and 61B-3 substantially simultaneously changes from closed to open, thereby causing the flow of gridline material portions 55-1, 55-2 and 55-3 into printhead 100B through inlet ports 116B-1, 116B-2 and 116B-3 to begin substantially simultaneously, which in turn causes extrusion of gridline material from central outlet orifices 169B-1, inner side outlet orifices 169B-21 and 169-22, and outer side outlet orifices 169B-31 and 169-32 onto upper surface 42 of substrate 51. As indicated at the bottom of FIG. 9(A), portions of resulting gridlines 44-1, 44-21, 44-22, 44-31 and 44-32 are thus printed onto upper surface 42 in a manner that forms front "two-step" pattern SP2F. That is, the sixty-four central outlet orifices are aligned in the cross-process direction, producing sixty-four central gridlines 44-1 having front edges that are aligned with and spaced from front edge 41F by a predetermined gap distance. Similarly, inner side outlet orifices 169B-21 and 169B-22 create four side gridlines 44-21 and four side gridlines 44-22 with respective front edges that are aligned in the cross-process direction and offset from the front edges of central gridlines 44-1 by a first step distance determined by offset distance O1 (see FIG. 7), and outer side outlet orifices 169B-31 and 169B-32 create four side gridlines 44-31 and four side gridlines 44-32 with respective front edges that are aligned in the cross-process direction and offset from the front edges of inner side gridlines 44-21/22 by a second step distance determined by offset distance O2 (see FIG. 7), thus forming front "two-step" pattern SP2F.

Figure 9B:
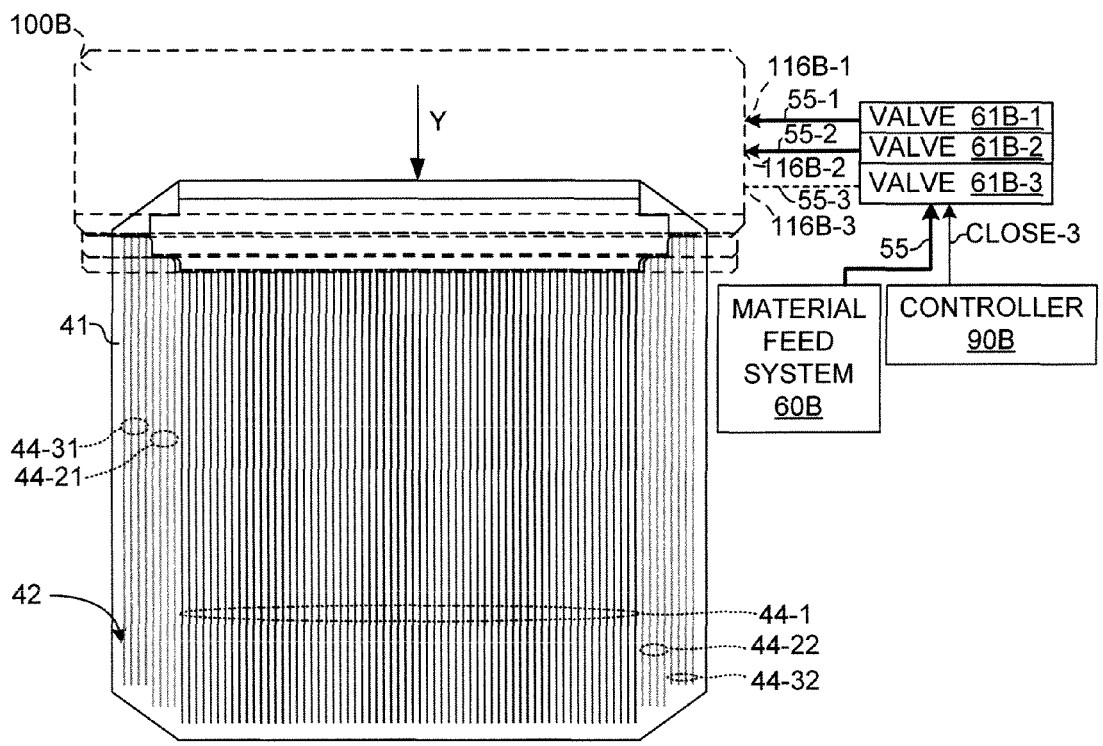

FIG. 9(B) illustrates a subsequent time when target substrate 41 has almost entirely passed under printhead 100B, and has reached a predetermined point corresponding to the back endpoint of outer side gridlines 44-31 and 44-32. The (second) relative position between substrate 41 and printhead 100B is determined, for example, using a sensor or a predetermined delay period. At this time controller 90B transmits valve close signal (second command) "CLOSE-3", whereby valve 61B-3 closes to terminate the flow of gridline material 55-3 through input port 116B-3 into printhead 100B, which in turn terminates the extrusion of gridline material from side orifices 169B-31 and 169B-32, thus forming back endpoints for side gridlines 44-31 and 44-32 that are aligned parallel to the cross-process X-axis direction, and are entirely disposed inside the peripheral edge of target substrate 41. Note that valves 61B-1 and 61B-2 remain in the open operating state such that gridline material 55-1 and 55-2 continues to flow into printhead assembly 100B through input ports 116B-1 and 116B-2, and thus continuing the formation of gridlines 44-1, 44-21 and 44-22.

Figure 9C:
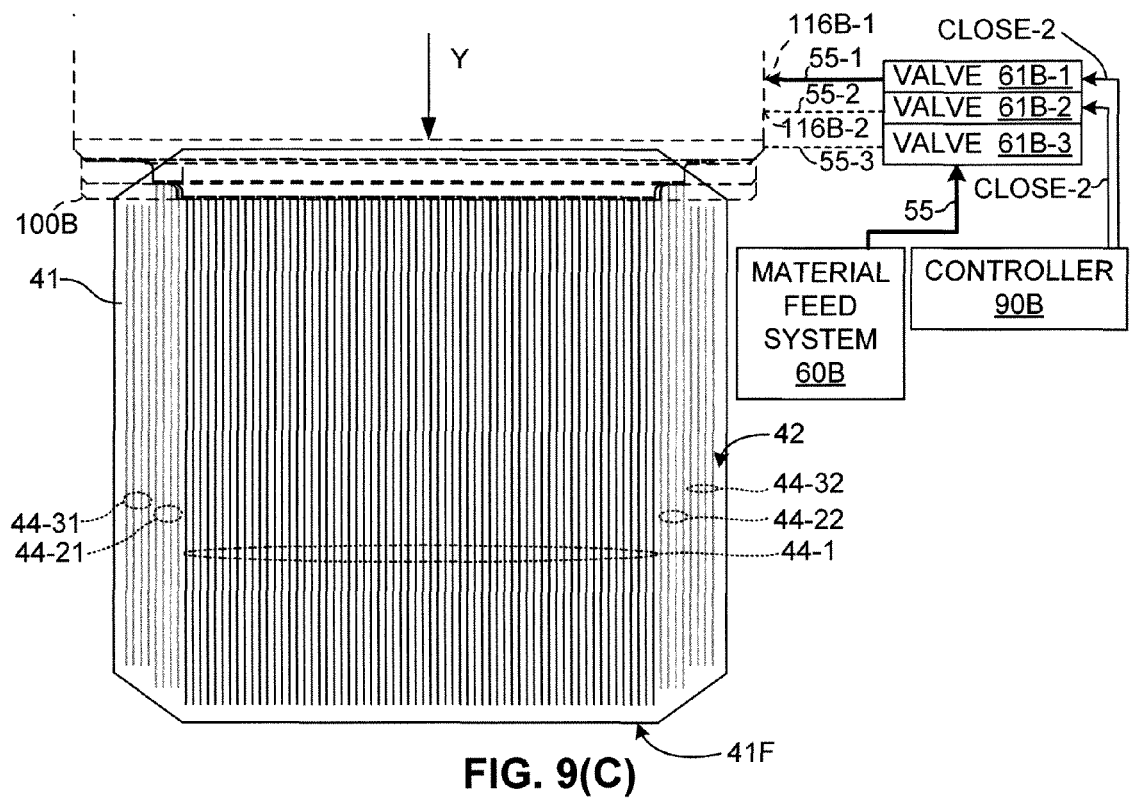

FIG. 9(C) illustrates an incrementally later time when target substrate 41 has reached a predetermined point corresponding to the back endpoint of inner side gridlines 44-21 and 44-22. This (third) relative position between substrate 41 and printhead 100B can be determined using a sensor, or by using a predetermined delay period based on the start or first stop commands. At this time controller 90B transmits valve close signal "CLOSE-2", whereby valve 61B-2 closes to terminate the flow of gridline material 55-2 through input port 116B-2 into printhead 100B, which in turn terminates the extrusion of gridline material from inner side orifices 169B-21 and 169B-22, thus forming back endpoints for inner side gridlines 44-21 and 44-22. Note that the incremental period between close signal "CLOSE-3" and close signal "CLOSE-2" causes the back endpoints of gridlines 44-21 and 44-22 to be offset by a step distance from the back endpoints of gridlines 44-31 and 44-32. Note also that valve 61B-1 remains in the open operating state such that gridline material 55-1 continues to flow into printhead assembly 100B through input port 116B-1, and thus continuing the formation of central gridlines 44-1. After an additional incremental time period, controller 90B sends a third close command CLOSE-1 to first valve 61B-1, thereby terminating the flow of gridline material 55-1 from valve 61B-1 through input port 116B-1 into printhead 100B, which in turn produces back endpoints of central gridline structures 44-1 that are aligned parallel to the cross-process (X-axis) direction and are spaced from back edge 41B by a predetermined gap distance.

Figure 9D:
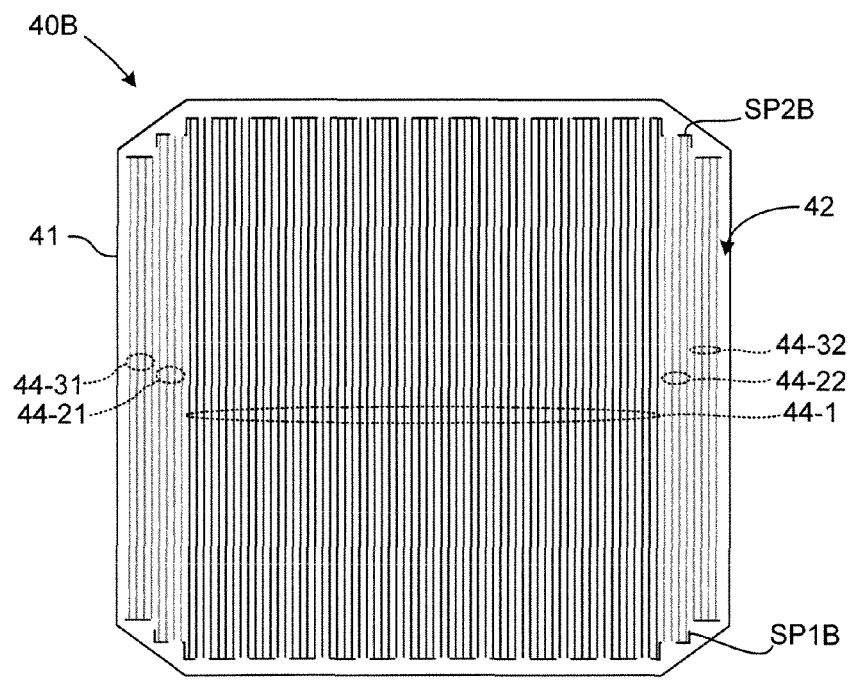

FIG. 9(D) shows solar cell 40B after the printing operation is completed, where target substrate 41 now includes longer central gridlines 44-1, incrementally shorter "inner side" gridlines 44-21 and 44-22, and shortest "outermost side" gridlines 44-31 and 44-32 disposed on upper surface 42, wherein the endpoints of these gridlines form front "two-step" pattern SP2F and back "two-step" pattern SP2B. This last (fourth) "stop" position of substrate 41 relative to printhead 100B can be determined by sensor or predetermined delay period as mentioned above. The printing operation described above with reference to FIGS. 9(A) to 9(D) provides advantages similar to those described above with reference to FIGS. 3(A) to 3(D), and, by disposing gridlines over a larger portion of surface 42 than can be achieved using the single-step approach described above with reference to FIGS. 3(A) to 3(D)), produces slightly greater cell electrical efficiency.

Figure 10:
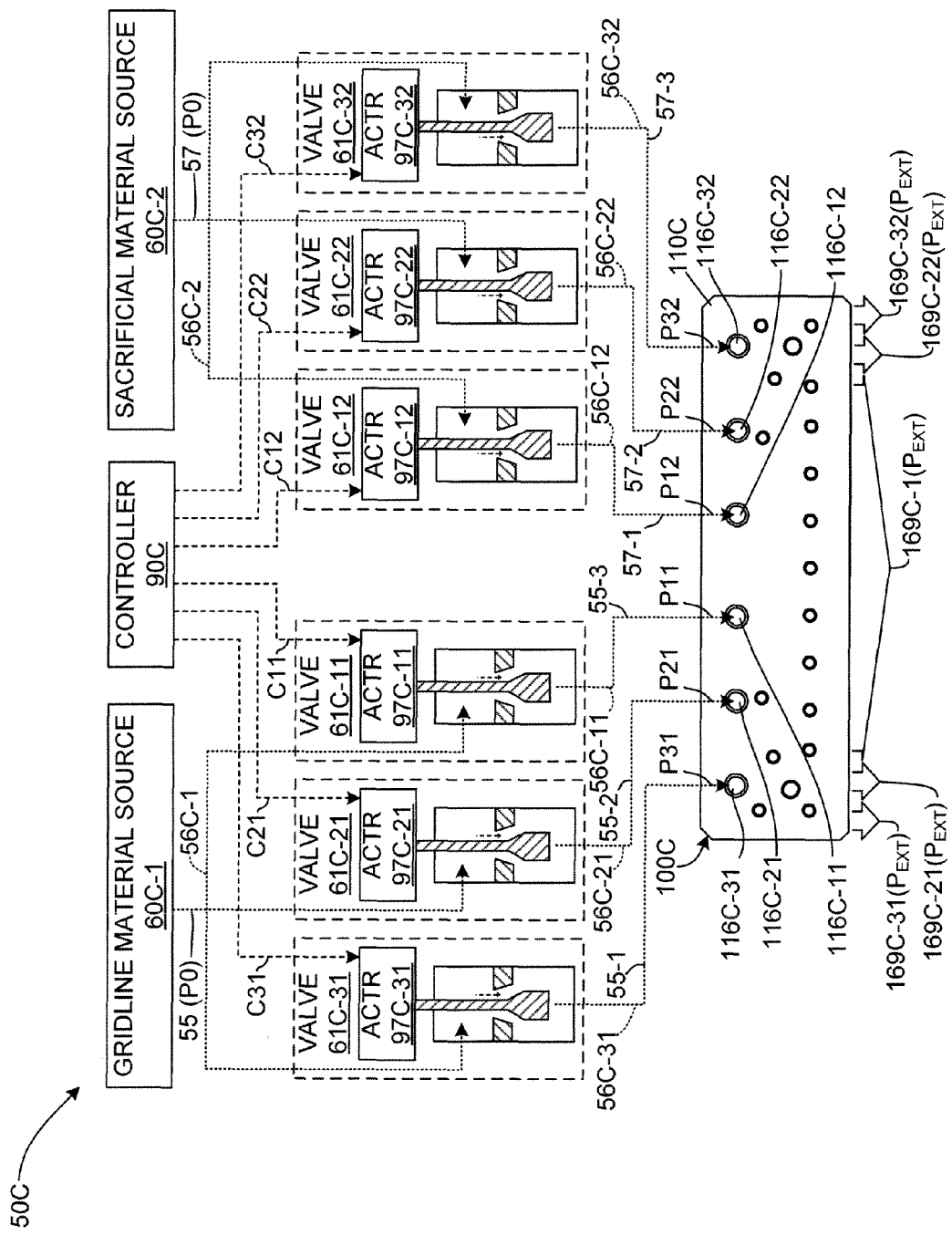
FIG. 10 is a simplified front view showing a co-extrusion system according to another specific embodiment of the present invention.

FIG. 10 is a simplified diagram depicting a portion of a micro-extrusion system 50C according to another specific embodiment of the present invention. Similar to the systems discussed above, system 50C includes a controller 90C that controls the flow of gridline material 55 from a gridline material source 60C-1 to a printhead 100C, which in this case includes outlet orifices arranged in the "two-step" pattern described above with reference to FIGS. 8 and 9 (i.e., as indicated by the arrows at the bottom of FIG. 10, a set of central orifices 169C-1, an inner set of side orifices 169C-21 and 169C-22, and an outer set of side orifices 169C-31 and 169C-32). As set forth in the following paragraphs, micro-extrusion system 50C introduces two additional features of the present invention that are not described in the earlier embodiments set forth above: first, system 50C includes a multiple spool-type valve arrangement in which gridline material 55 is supplied to two or more spool-type valves (e.g., gridline vehicle valves 61C-11, 61C-21 and 61C-31) that are individually configured to pass gridline material 55 to printhead 100C at predetermined inlet pressures; and second, printhead assembly 100C is constructed as set forth below to co-extrude both gridline material 55 and a sacrificial material 57, which is supplied by way of a second set of spool-type sacrificial vehicle valves 61C-12, 610-22 and 61C-32 from a sacrificial material source 60C-2, in a manner that generates parallel high-aspect ratio gridline structures (described below with reference to FIG. 14). In addition to the system features and components illustrated in FIG. 10, system 50C includes a conveyor, an X-Y-Z positioning mechanism, and other components similar those described above, which are omitted below for brevity. Although both the spool-type valve arrangement and the co-extrusion printhead features are described below with reference to a single specific embodiment, these features may be implemented separately (e.g., the spool-type valve arrangement may be utilized separate from a co-extrusion printhead assembly).

In accordance with the exemplary multiple spool valve arrangement shown in FIG. 10, system 50C includes a pressurized container (gridline material source 60C-1) that supplies gridline material 55 into a supply flow path portion 56C-1 at a relatively high (first) pressure P0, and dispense valves 61C-11, 61C-21 and 61C-31 that are configured (pre-adjusted) to regulate the flow pressure of the gridline material portions 55-1, 55-2 and 55-3 supplied to printhead 100C such that gridline material is extruded through all of the outlet orifices (i.e., each center outlet orifice 169C-1, each inner side outlet orifice 169C-21 and 169C-22, and each outer side outlet orifice 169C-31 and 169C-32).

A benefit of utilizing pressurized gridline material source 60C-1 and multiple spool valves 61C-11, 61C-21 and 61C-31 is that this feature of the multiple spool-type valve arrangement facilitates immediate and precise control over the stop/start of gridline material flow into printhead 100C. Directly dispensing gridline material by pressurizing and de-pressurizing a large container of gridline material is too slow to neatly and reliably stop the gridlines in the outer print regions associated with the present invention while the head is still moving relative to the wafer while the inner gridlines are still printing.

Another benefit of the multiple spool valve arrangement is that, by individually configuring gridline vehicle valves 61C-11, 61C-21 and 61C-31 to supply gridline material at appropriate printhead inlet pressures, the gridline material flow from every nozzle outlet orifice of printhead 100C can be controlled.

Figure 10A:
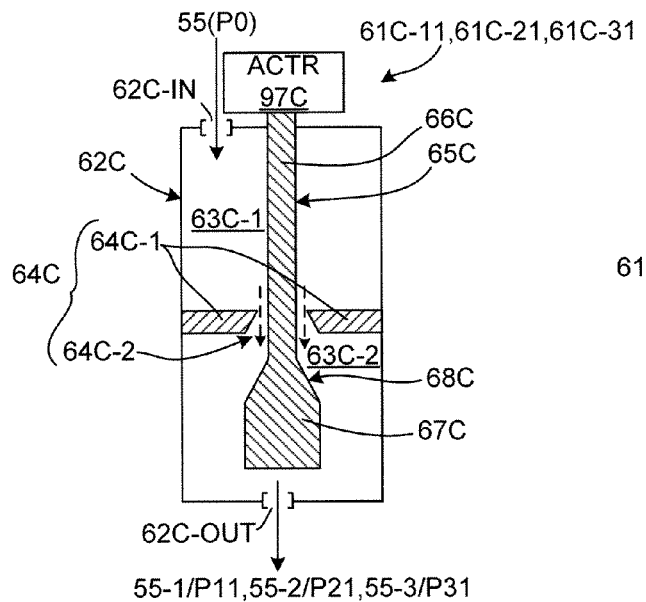
FIGS. 10(A), 10(B) and 10(C) are simplified diagrams showing various operating states of one of the valves utilized in the co-extrusion system of FIG. 10.
Figure 10B:
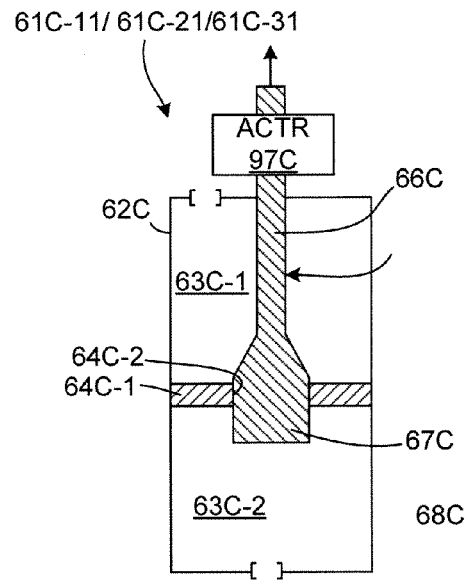
Figure 10C:
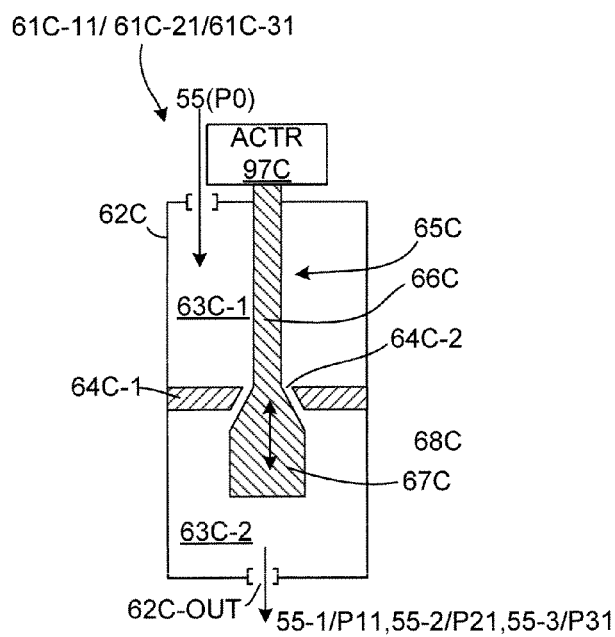

FIGS. 10(A)-10(C) show an exemplary one of dispense valves 61C-11, 61C-21 and 61C-31 in additional detail. Referring to FIG. 10(A), each dispense valve 61C-11, 61C-21 and 61C-31 includes a spool-type valve mechanism generally made up of an outer case 62C containing a fixed seal structure 64C, a movable piston 65C, and an actuator (ACTR) 97C.

Outer case 62C is a pressure container defining an inlet port 62C-IN through which gridline material is received at pressure P0 from gridline material source 60C-1 (as shown in FIG. 10) into a first inner chamber portion 63C-1, and an outlet port 62C-OUT that passes gridline material from a second inner chamber portion 63C-2 at one of desired inlet pressures P11, P21 or P31 to printhead 100C (no shown). Fixed seal structure 64C is fixedly disposed inside outer case 62C between first inner chamber portion 63C-1 and second inner chamber portion 63C-2, and includes a seal 64C-1 (e.g., an o-ring, gasket or cup-seal) that defines a central opening 64C-2.

Movable piston 65C includes a relatively small diameter shaft 66C, a relatively large diameter stopper 67C, and a conic surface 68C that tapers from the relatively large diameter of stopper 67C to the relatively small diameter of shaft 66C. A first portion of shaft 66C disposed outside outer case 62C is operably connected to actuator 97C, and a second portion of shaft 66C extends through first inner chamber portion 63C-1 into central opening 64C-2 (i.e., such that stopper 67C is generally disposed in second inner chamber portion 63C-2).

Actuator 97C (e.g., a pneumatic, hydraulic, or electro-mechanical motor or other driving/motion mechanism) is maintained in a fixed position relative to outer case 62C, and serves to position stopper 67C either outside of opening 64C-2 (as shown in FIG. 10(A)) or inside opening 64C-2 (as shown in FIG. 10(B)) by driving shaft 66C into or out of outer case 62C in response to "print start" and "print stop" commands received from controller 90C (shown in FIG. 10). That is, in response to a "print start" command, actuator 97C pushes shaft 66C into outer case 62C (i.e., downward in FIG. 10(A)) until stopper 67C is disposed outside of central opening 64C-2 (i.e., into the opened operating state) such that gridline material is able to flow between the inner edge of seal 64C-1 and shaft 66C between first chamber portion 63C-1 and second chamber portion 63C-2, as indicated by the dashed-line arrows in FIG. 10(A). The difference in diameters between shaft 66C and stopper 67C determines the size of the opening for gridline material (paste) flow when the valve is opened. Conversely, as shown in FIG. 10(B), in response to a "print stop" command, actuator 97C pulls shaft 66C out of outer case 62C (i.e., upward in FIG. 10(B)) until stopper 67C is disposed in central opening 64C-2, thereby blocking the flow of gridline material from first chamber portion 63C-1 to second chamber portion 63C-2. Note that the length of shaft 66C must be sufficient for adequate valve opening/closing, and the outer surface of stopper 67C must be smooth for adequate sealing to prevent gridline material flow in the closed position.

As indicated in FIG. 10(C), an advantage of the spool-type valve arrangement is that the output flow pressure is individually calibrated (pre-adjustable) for each dispense valve 61C-11, 61C-21 and 61C-31 by adjusting the position of stopper 67C relative to central opening 64C-2 when the valve is in the "opened" position. To calibrate (pre-adjust) dispense valves 61C-11, 61C-21 and 61C-31 for a relatively low outlet flow pressure P11, P21 or P31 of gridline material 55-1, 55-2 or 55-3 exiting the associated valve, the effective length of shaft 66C extending from actuator 97C is reduced such that stopper 67C is positioned relative close to central opening 64C-2 when the valve is in the "opened" position, as indicated in FIG. 10(C). That is, by calibrating (pre-adjusting) the associated valve in this manner, stopper 67C moves into the relatively close position (e.g., as depicted in FIG. 10(C)) whenever the associated valve receives a "print start" command from the controller. Because the opened operating state provides a relatively small flow path, gridline material is able to flow from first chamber portion 630-1 to second chamber portion 63C-2 through outlet 62C-OUT, but the flow rate is restricted, thus reducing the valve's outlet flow pressure P11, P21 and P31. In contrast, to calibrate (pre-adjust) dispense valves 61C-11, 61C-21 and 61C-31 for a relatively high outlet flow pressure P11, P21 or P31 of gridline material 55-1, 55-2 or 55-3 exiting the associated valve, the effective length of shaft 66C extending from actuator 97C is increased such that stopper 67C is positioned relative far from central opening 64C-2 when the valve is in the "opened" position, as indicated in FIG. 10(A). By adjusting the "opened" position of stopper 67C (i.e., by setting the effective length of shaft 66C extending from actuator 97C) prior to the start of a production such that the flow pressure in each nozzle 169C-1, 169C-21, 169C-22, 169C-31 and 169C-32 is substantially equal.

As mentioned above with reference to FIG. 10, a second feature of system 50C is that printhead assembly 100C is constructed to simultaneously co-extrude both gridline material 55 and a sacrificial material 57 in a manner that generates parallel high-aspect ratio gridline structures. Similar to the system and method for supplying gridline material 55 to printhead 100C, sacrificial material 57 is supplied from sacrificial material feed system 60C-2 (e.g., a second pressurized container) along a second supply flow path 56C-2 at a (second), which may be initial pressure P0 of gridline material 55, or may be a different pressure. To achieve simultaneous extrusion of the gridline and sacrificial materials, controller 90C is modified to transmit a single "print-start" command on signal lines C11, C12, C21, C22, C31 and C32 to actuators 97C-11, 97C-12, 97C-21, 97C-22, 97C-31 and 97C-32, respectively, such that all valves 61C-11, 61C-12, 61C-21, 61C-22, 61C-31 and 61C-32 are adjusted from the closed operating state to the opened operating state in the manner described above. Each sacrificial material flow control valve is also simultaneously closed with its associated gridline material flow control valve (i.e., valves 61C-31 and 61C-32 are simultaneously closed using a first "print-stop" (close) command signal, valves 61C-21 and 61C-22 are simultaneously closed using a second "print-stop" command signal, and then valves 61C-11 and 61C-12 are simultaneously closed using a third "print-stop" command signal). In addition, similar to the gridline supply system, sacrificial vehicle valves 61C-12, 61C-22 and 61C-32 are spool-type valves substantially identical to those described above with reference to FIGS. 10(A)-10(C), and are calibrated (pre-adjusted) to supply sacrificial material portions 57-1, 57-2 and 57-3 to inlet ports 116C-12, 116C-22 and 1160-32 of printhead 100C at inlet pressures P12, P22 and P32, respectively, such that both the gridline material and the sacrificial material are co-extruded from each outlet orifice 169C-1, 169C-21, 169C-22, 169C-31 and 169C-32.

Figure 11:
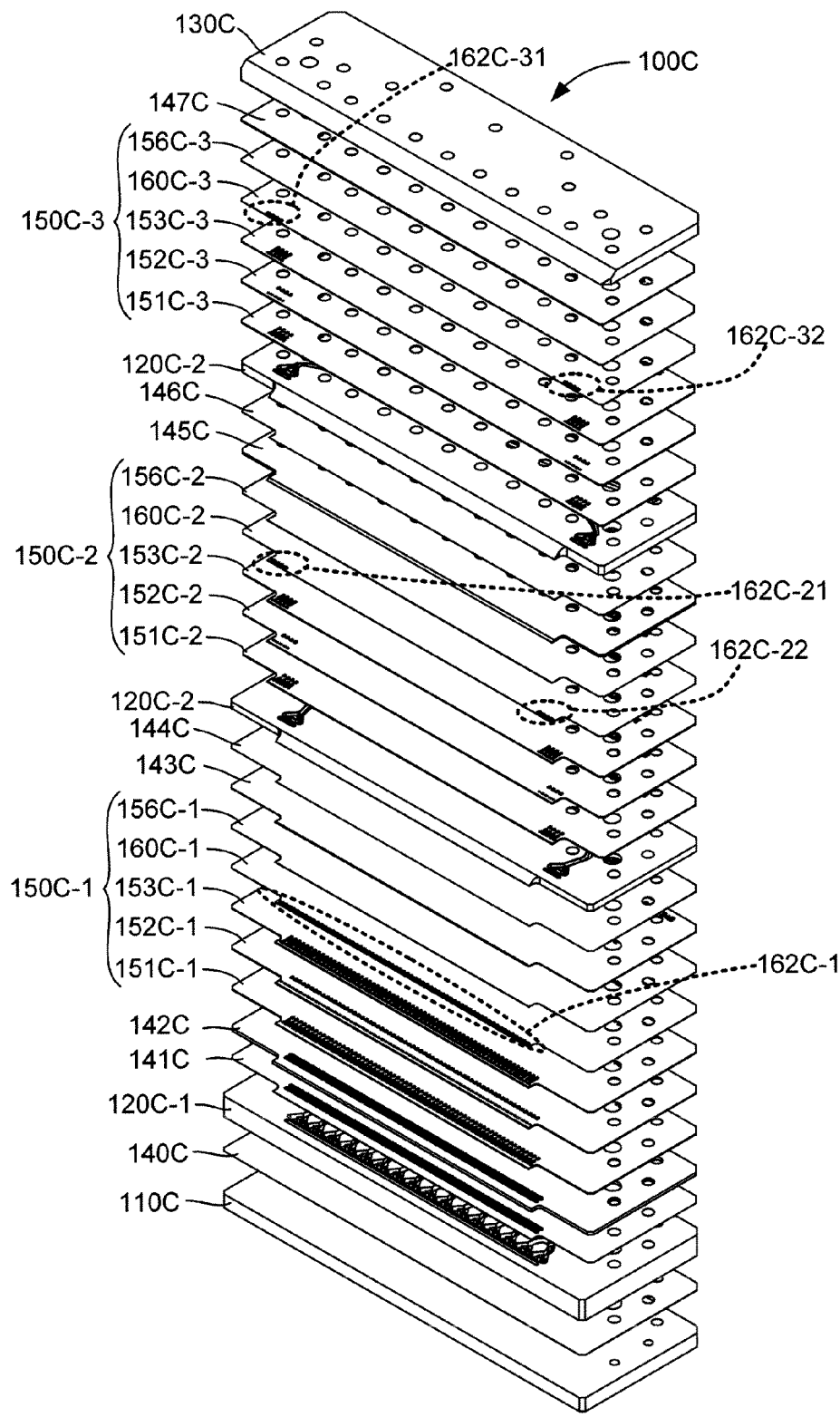
FIG. 11 is an exploded perspective view of the micro-extrusion printhead assembly utilized in the co-extrusion system of FIG. 10.
Figure 12:
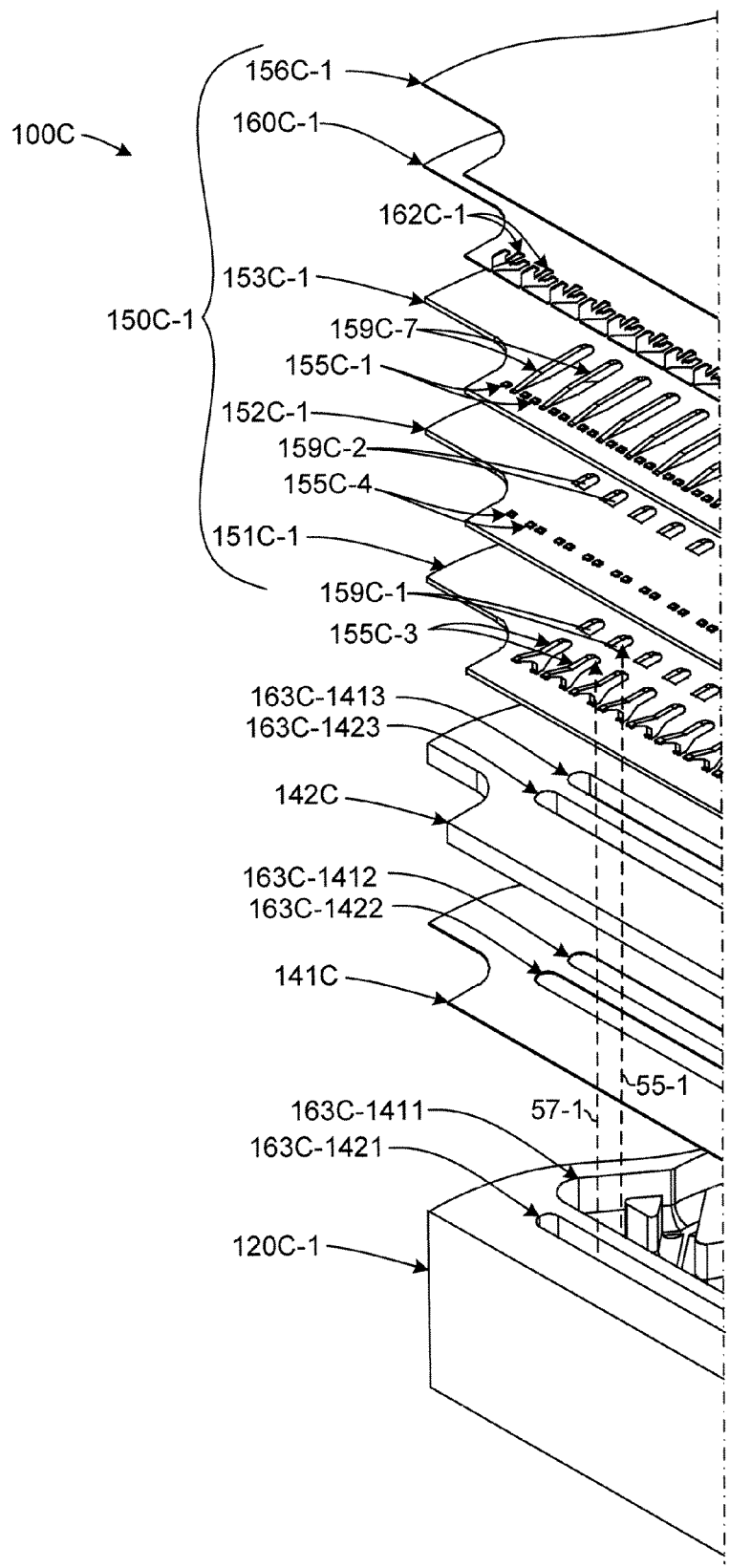
FIG. 12 is an enlarged partial exploded perspective view showing an exemplary portion of the micro-extrusion printhead assembly of FIG. 11 in additional detail.
Figure 13:
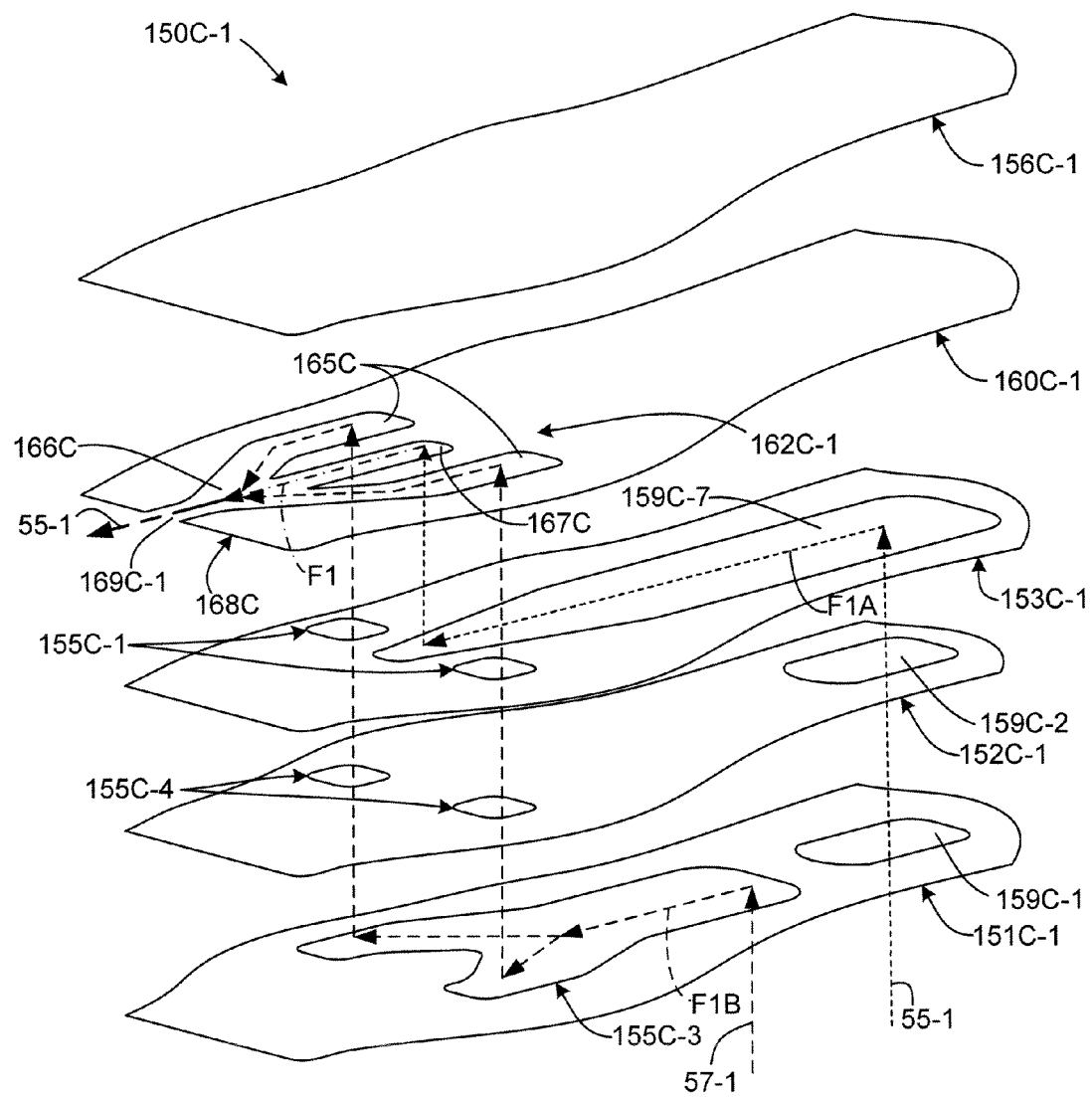
FIG. 13 is a simplified diagram depicting a single co-extrusion nozzle of the printhead assembly of FIG. 11.

FIGS. 11-13 are exploded perspective bottom view showing co-extrusion printhead assembly 100C in additional detail, where FIG. 11 shows printhead assembly 100C in its entirety, FIG. 12 is an enlarged partial perspective view showing an exemplary portion of printhead assembly 100C, and FIG. 13 is a simplified diagram depicting a single co-extrusion nozzle of printhead assembly 100C.

Referring to FIG. 11, micro-extrusion printhead assembly 100C includes an upper (first) plate 110C, a second (lower) plate 130C, three plenums 120C-1, 120C-2 and 120C-3, three multi-layered nozzle structures 150C-1, 150C-2 and 150C-3, and various gasket and spacer plates 140C-147C that are bolted or otherwise fastened together in the stacked arrangement depicted in FIG. 11. That is, each multi-layered nozzle structure 150C-1, 150C-2 and 150C-3 is matched with an associated plenum 120C-1, 120C-2 and 120C-3 and sandwiched between plates 110C and 130C, which function as described in the earlier embodiments to hold the stacked arrangement together by way of bolts (not shown). The unified structure (shown, e.g., in FIG. 12) is attached to an X-Y-Z positioning mechanism during operation by a back piece (not shown) in a manner described above with reference to FIG. 8.

Similar to the description provided above, bores/conduits are defined through upper plate 110C and intervening layers (wafers) to feed extrusion and sacrificial material to layered nozzle structures 150C-1, 150C-2 and 150C-3. For example, as indicated in FIG. 10, gridline material 55-1 and sacrificial material 57-1 respectively enter printhead 100C through inlet ports 116C-11 and 116C-12 defined in upper plate 110C. Referring to FIG. 11, two flow channel regions similar to vertical flow channel region 163B-12 (described above with reference to FIG. 8) extend through plate 110C and gasket/spacer wafer 140C to pass gridline and sacrificial materials to plenum layer 120C-1. Plenum layer 120C-1 includes two flow distribution channel portions similar to that described above with reference to FIG. 6(A) that distribute gridline material and sacrificial material to central nozzle channels 162C-1 in the manner described in additional detail below. In addition, as indicated in FIG. 10, gridline material 55-2 and sacrificial material 57-2 respectively enter printhead 100C through inlet ports 116C-21 and 116C-22 defined in upper plate 110C, and gridline material 55-3 and sacrificial material 57-3 respectively enter printhead 100C through inlet ports 116C-31 and 116C-32 defined in upper plate 110C. Each of these gridline and sacrificial material flows passes through the various layers to plenums 120C-1 and 120C-2, respectively, by way of flow vertical flow channel regions similar to vertical flow channel regions 163B-22 and 163B-32 (described above with reference to FIG. 8). Each of plenum layers 120C-2 and 120C-3 respectively include two flow distribution channel portions similar to that described above with reference to FIG. 6(B) that distribute gridline material and sacrificial material to inner side nozzle channels 162C-21 and 162C-22 and outer side nozzle channels 162C-31 and 162C-32 in the manner described in additional detail below.

Each layered nozzle structures 150C-1, 150C-2 and 150C-3 various feed layer and nozzle plates that collectively supply gridline material and sacrificial material to associated nozzle channels. For example, layered nozzle structure 150C-1 includes a first feed layer plate 151C-1, a second feed layer plate 1520-1, a top nozzle plate 153C-1, a bottom nozzle plate 156C-1, a nozzle outlet plate 160C-1 sandwiched between top nozzle plate 153C-1 and bottom nozzle plate 156C-1, and receives gridline material 55-1 and sacrificial material 57-1 from plenum 120C-1 by way of gasket/spacer wafers 141C and 142C in the manner described below with reference to FIG. 12. Similarly, layered nozzle structure 150C-2 includes feed layer plates 151C-2 and 152C-2, a top nozzle plate 153C-2, a nozzle outlet plate 160C-2 and a bottom nozzle plate 156C-2, and receives gridline material 55-2 and sacrificial material 57-2 from plenum 120C-2, and layered nozzle structure 150C-3 includes feed layer plates 151C-3 and 152C-3, a top nozzle plate 153C-3, a nozzle outlet plate 160C-3 and a bottom nozzle plate 156C-3, and receives gridline material 55-3 and sacrificial material 57-3 from plenum 120C-3. Layered nozzle structures 150C-2 and 150C-3 are constructed and functions essentially as described below with reference to FIG. 12.

FIG. 12 is an enlarged view showing a portion of printhead assembly 100C including exemplary portions of plenum 120C-1 and layered nozzle structure 150C-1 (and intervening gasket/spacer wafers 141C and 142C) in additional detail, and depicts a portion of the flow of gridline material 55-1 and sacrificial material 57-1 from plenum 120C-1 into layered nozzle structure 150C-1 during a gridline printing operation. Referring to the lower portion of FIG. 12, gridline material 55-1 is distributed through a first set of flow channels formed in plenum 120C-1 to plenum outlet portion 163C-1411, and is then guided through slot-like plenum outlet portions 163C-1412 and 163C-1413 respectively defined in first feed layer plates 151C-1 and second feed layer plates 152C-1 to feed holes 159C-1 defined in top nozzle plate 153C-1, and sacrificial material 57-1 is distributed through a second set of flow channels formed in plenum 120C-1 to plenum outlet portion 163C-1421, and is then guided through slot-like plenum outlet portions 163C-1422 and 163C-1423 respectively defined in first feed layer plates 151C-1 and second feed layer plates 152C-1 to Y-shaped through holes 155C-3 defined in top nozzle plate 153C-1. As set forth in additional detail below, gridline material 55-1 passes from first feed holes 159C-1 (first feed layer 151C-1) through feed holes 159C-2 (formed in second feed layer 152C-1) to a rear end of elongated opening 159C-7 (formed in top nozzle plate 153C-1), and then from elongated opening 159C-7 to an associated three-part nozzle three-part nozzle channels 162C-1 (defined in nozzle outlet plate 160C-1). Similarly, sacrificial material 57-1 passes from Y-shaped through holes 155C-3 (first feed layer 151C-1) through feed holes 155C-4 (formed in second feed layer 1520-1) and feed holes 155C-1 (formed in top nozzle plate 153C-1) to an associated three-part nozzle three-part nozzle channels 162C-1 (defined in nozzle outlet plate 160C-1). Each of layered nozzle structures 150C-1, 150C-2 and 150C-3 utilizes a similar flow distribution system to distribute gridline and sacrificial material to the "side" nozzles (e.g., nozzles 162C-21, 162C-22, 162C-31 and 162C-32, shown in FIG. 11.

As indicated by the dashed arrows in FIG. 13, gridline material 55-1 entering layered nozzle structures 150C-1 passes through aligned openings 159C-1 and 159C-2 respectively formed in first feed layer plate 151C-1 and second feed layer plate 152C-1, and then enters a rear portion of elongated channel 159C-7. Gridline material 55-1 then flows along elongated channel 159C-7 as indicated by arrow F1A, and the flows upward into a central channel 167C of three-part nozzle channel 162C-1. Gridline material 55-1 then flows forward along central channel 167C to a merge point 166C, where it is pressed between two sacrificial material flows before exiting outlet orifice 169C-1. Referring again to the bottom of FIG. 13, sacrificial material 57-1 entering layered nozzle structures 150C-1 passes into the rearward end of Y-shaped elongated channels 155C-3, which are formed in first feed layer plate 151C-1. As indicated by dashed arrow F1B in FIG. 13, sacrificial material 57-1 flows along Y-shaped elongated channel 155C-3 to a split front end region, where sacrificial material 57-1 is distributed through corresponding openings 155C-4 defined in second feed layer plate 152C-1 and openings 155C-1 defined in top nozzle plate 153C-1, and then into opposing side channels 165C of three-part nozzle channel 162C-1. Sacrificial material 57-1 then flows forward along opposing side channels 165C to merge point 166C, where the two flows are pressed against opposing sides of the gridline material entering merge point 166C from central channel 167C before exiting outlet orifice 169C-1.

Each arrowhead-shaped three-part nozzle channel (e.g., nozzle channel 162C-1 shown in FIG. 13) of printhead assembly 100C is configured such that the co-extruded gridline and sacrificial materials form high aspect ratio gridline structures disposed between two sacrificial material portions. As indicated in FIG. 13, nozzle output plate 160C-1 is a metal (or other hard material) plate that is micro-machined to include central channel 1670 and opposing (first and second) side channels 165C, where central channel 167C is separated from each side channel 165C by an associated tapered finger of plate material. Central channel 167C has a closed end that is aligned to receive gridline material 55-1 from the front end of elongated opening 159C-7 of top nozzle plate 153C-1, and an open end that communicates with merge point 166C. Similarly, side channels 165C have associated closed ends that are aligned to receive sacrificial material 57-1 from corresponding openings 155C-1 of top nozzle plate 153C-1, and open ends that communicate with a merge point 166C. Side channels 165C are angled toward central channel 167C such that sacrificial material 57-1 entering merge point 166C from side channels 165C presses against opposing sides of gridline material 55-1 entering merge point 166C from central channel 167C, thereby causing sacrificial material 57-1 to form gridline material 55-1 into a high-aspect ratio gridline structure, as described below with reference to FIG. 14.

Figure 14:
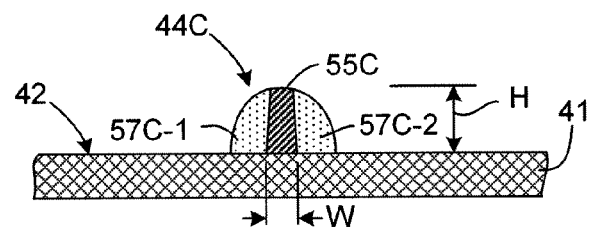
FIG. 14 is a simplified end view showing an exemplary extruded structure generated by a single co-extrusion nozzle of the printhead assembly of FIG. 11.
Figure 15:
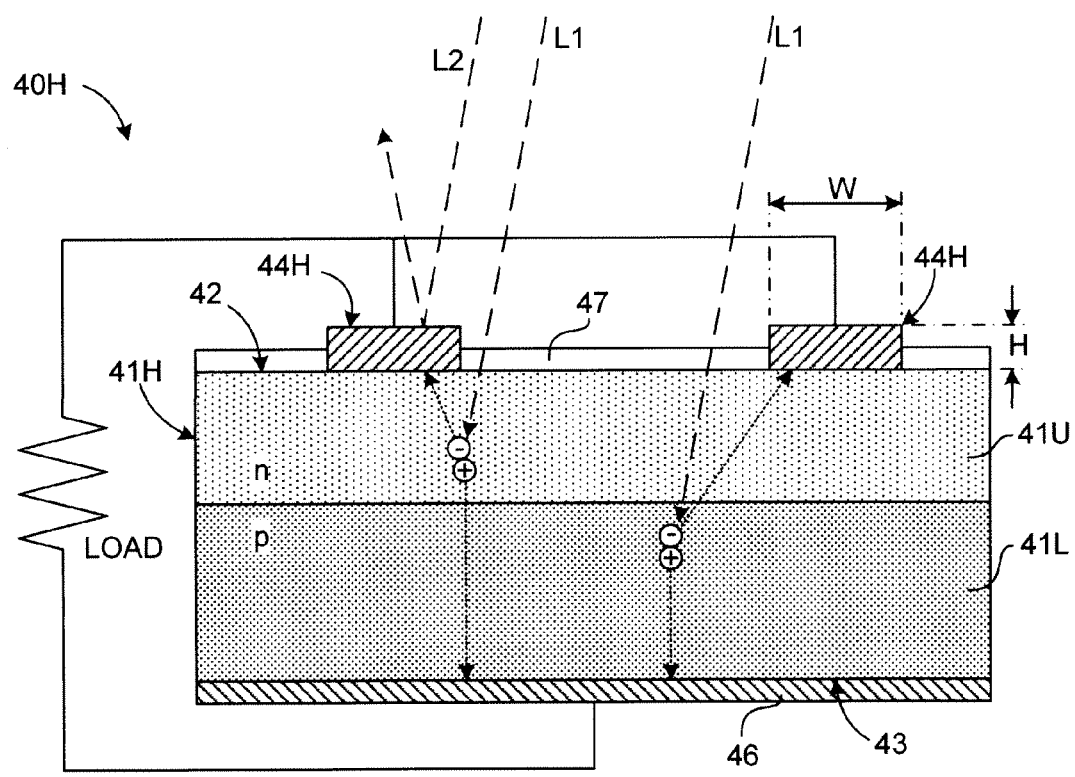
FIG. 15 is a simplified cross-sectional side view showing a conventional solar cell.
Figure 16A:
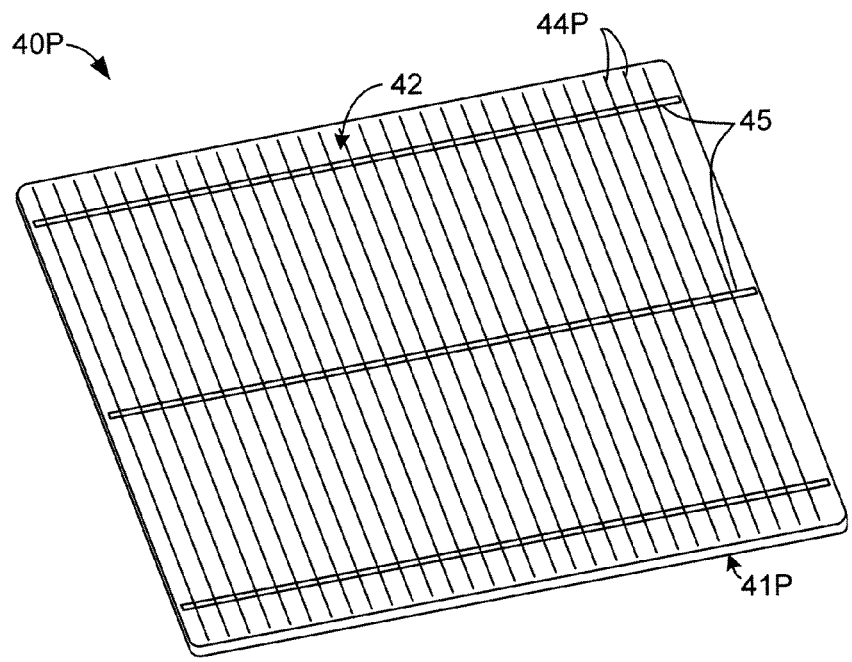
FIGS. 16(A) and 16(B) are top and bottom perspective views, respectively, showing a conventional H-pattern solar cell.
Figure 16B:
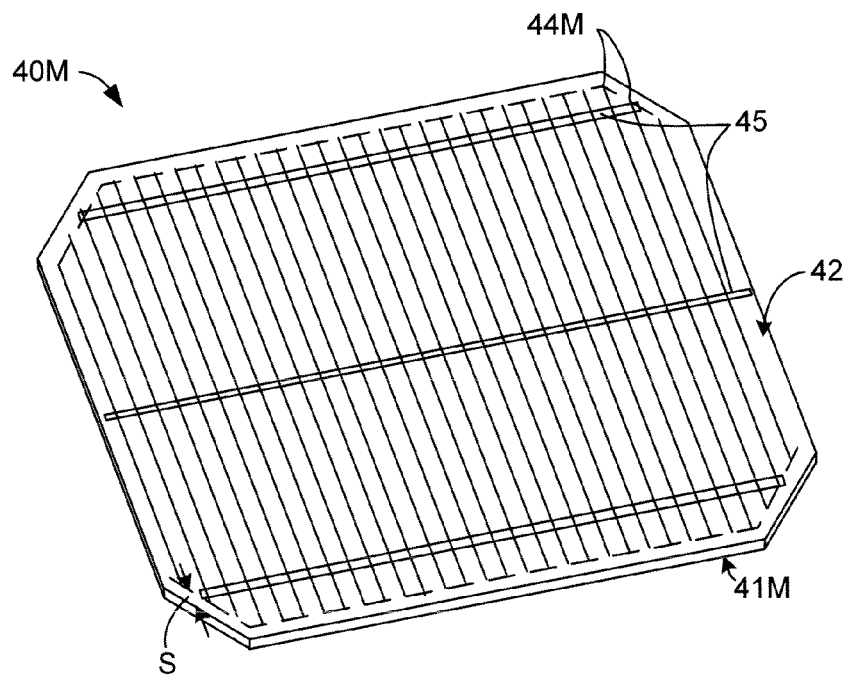
Figure 17:
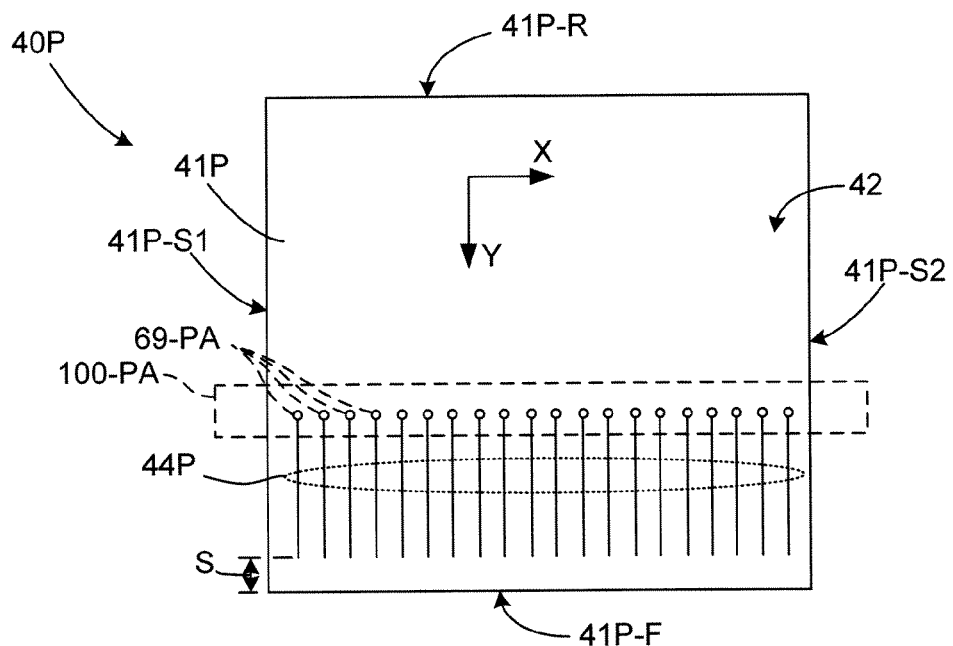
FIG. 17 is a simplified top view depicting a gridline printing process using a conventional extrusion printhead.
Figure 18:
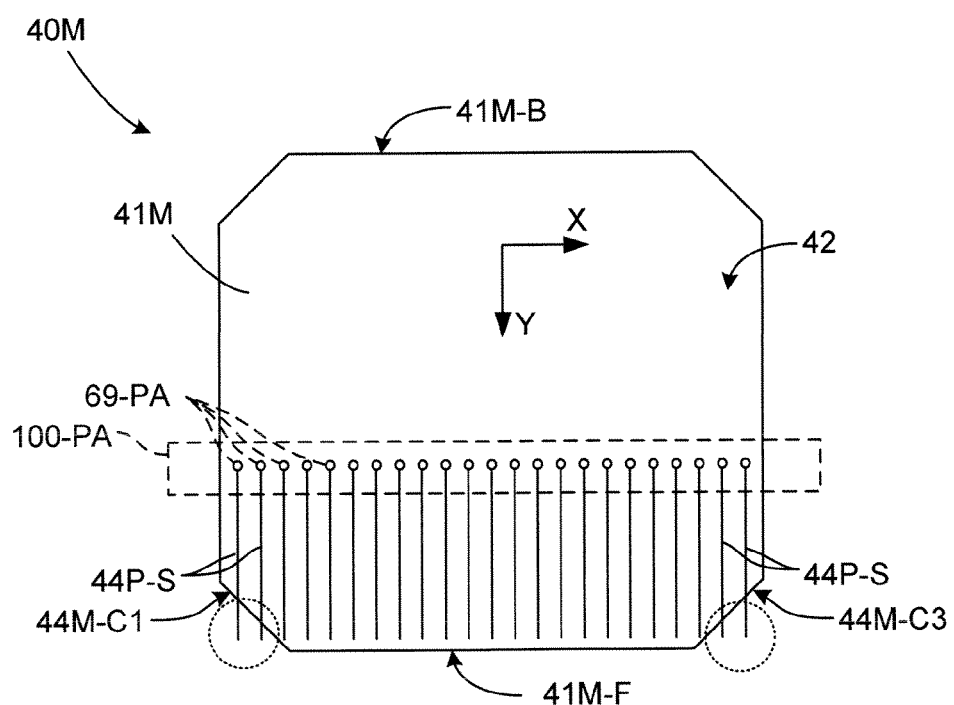
FIG. 18 is a top plan view depicting the formation gridlines on a non-rectangular substrate using the conventional extrusion printhead shown in FIG. 17.

As shown in FIG. 14, the gridline material and sacrificial material co-extruded through each nozzle outlet orifice (e.g., as indicated by orifice 169C-12 in FIG. 13) of co-extrusion printhead assembly 100C during the extrusion process forms an elongated extruded structure 44C on surface 42 of substrate 41 with the gridline material of each structure 44C forms a high-aspect ratio gridline structure 55C, and such that the sacrificial material of each structure 44C forms associated first and second sacrificial material portions 57C-1 and 57C-2 respectively disposed on opposing sides of the associated high-aspect ratio gridline 55C. As used in the context of the present invention, the phrase "high-aspect ratio gridline" means that a ratio of the height H to the width W of each gridline structure 55C is about 0.5 or greater. The shape of extruded structures 44C (i.e., the aspect ratio of gridline material 55C and the shape of sacrificial portions 57C-1 and 57C-2) are controllable through at least one of the shapes of the one or more outlet orifices and internal geometry of printhead assembly 100C, characteristics of the materials (e.g., viscosity, etc.), and the extrusion technique (e.g., flow rate, pressure, temperature, etc.). The structure within the printhead assembly and the shape of the nozzle outlet orifices may be modified to further enhance the extrusion process using known techniques. Suitable gridline materials 55 include, but are not limited to, silver, copper, nickel, tin, aluminum, steel, alumina, silicates, glasses, carbon black, polymers and waxes, and suitable sacrificial materials 57 include plastic, ceramic, oil, cellulose, latex, polymethylmethacrylate etc., combinations thereof, and/or variations thereof, including combining the above with other substances to obtain a desired density, viscosity, texture, color, etc. To limit the tendency for the materials to intermix after extrusion, extruded beads leaving co-extrusion printhead 100C can be quenched on substrate 41 by cooling the substrate using known techniques. Alternately, the gridline (paste) material used may be a hot-melt material, which solidifies at ambient temperatures, in which case co-extrusion printhead 100C is heated, leaving the extruded structures to solidify once they are dispensed onto substrate 41. In another technique, the materials can be cured by thermal, optical and/or other means upon exit from co-extrusion printhead 100C. For example, a curing component can be provided to thermally and/or optically cure the materials. If one or both materials include an ultraviolet curing agent, the material can be bound up into solid form in order to enable further processing without mixing.

Although the present invention has been described with respect to certain specific embodiments, it will be clear to those skilled in the art that the inventive features of the present invention are applicable to other embodiments as well, all of which are intended to fall within the scope of the present invention. For example, although the present invention is described above with reference to printheads for generating solar cells with gridlines having one-step and two-step endpoint patterns, the present invention may be extended to embodiments producing additional "steps", but such an arrangement would require additional valves and additional printhead plenums and nozzles. In addition, although the printhead is described with reference to multi-layered printhead structures, the gist of the present invention may be achieved by printheads constructed using other techniques that have the offset orifice arrangements described herein.

The invention claimed is:

1. A micro-extrusion system for printing parallel gridlines on a pseudo-square substrate such that the gridlines extend in a process direction, the system comprising:
    a gridline material feed system for supplying a gridline material along a supply flow path;
    a micro-extrusion printhead assembly including:
    a plurality of first nozzle channels, each said first nozzle channel having a first outlet orifice that is disposed in a central cross-process region of said printhead assembly,
    a first flow channel communicating between a first inlet port and each of said plurality of first nozzle channels,
    a first set of second nozzle channels, each said second nozzle channel of the first set having a second outlet orifice that is disposed in a first cross-process side region located outside of said central cross-process region;
    a second set of second nozzle channels, each said second nozzle channel of the second set having a second outlet orifice that is disposed in a second cross-process side region located outside of said central cross-process region, said central cross-process region being located between the first and second cross-process side regions; and
    a second flow channel communicating between a second inlet port and each said second outlet orifice of said first and second sets of second nozzle channels, wherein each of said first outlet orifices is offset in the process direction from each said second outlet orifice of said first and second sets of second nozzle channels by an offset distance;
    a first valve disposed in the supply flow path between the gridline material feed system and the first inlet port;a second valve disposed in the supply flow path between the gridline material feed system and the second inlet port; and
    a controller configured to control operation of the first valve and the second valve such that both the first and second valves open in response to a start signal, and such that both the first and second valves simultaneously initiate extrusion of portions of said gridline material into said printhead at a print start time, whereby front endpoints of gridlines formed by the extruded gridline material form a first step pattern, said controller further configured such that said second valve is closed in response to a first stop command at a second time after the print start time, and such that the first valve is closed in response to a second stop command at a third time after the second start time, whereby back endpoints of gridlines formed by the extruded gridline material form a second step pattern.

2. The micro-extrusion system according to claim 1, wherein said controller is further configured to transmit a second command to the second valve when the pseudo-square substrate is in a second position relative to the printhead, and configured to transmit a third command to the first valve when the pseudo-square substrate is in a third position relative to the printhead.

3. The micro-extrusion system according to claim 1,
    wherein said micro-extrusion printhead assembly further includes:
    a first set of third nozzle channels, each said third nozzle channel of the first set having a third outlet orifice that is disposed in a third cross-process side region located outside of said central cross-process region and said first cross-process side region,
    a second set of third nozzle channels, each said third nozzle channel of the second set having a third outlet orifice that is disposed in a fourth cross-process side region located outside of said central cross-process region and said second cross-process side region; and
    a third flow channel communicating between a third inlet port and each said third outlet orifice of said first and second sets of third nozzle channels, wherein each of said third outlet orifices is offset in the process direction from each said second outlet orifice of said first and second sets of second nozzle channels by a second offset distance; and
    wherein the system further includes a third valve disposed between in the supply flow path between the gridline material feed system and the third inlet port; and
    wherein said controller is further configured to control the third valve such that the first, second and third valves initiate extrusion simultaneously to pass portions of said gridline material into said printhead at said print start time.

4. The micro-extrusion system according to claim 3, wherein said controller is further configured to simultaneously transmit a first command to each of the first, second and third valves when the pseudo-square substrate is in a first position relative to the printhead such that first endpoints of gridlines subsequently formed on the pseudo-square substrate by gridline material extruded from the first, second and third orifices form said first step pattern.

5. The micro-extrusion system according to claim 3, wherein said controller is further configured to transmit a third stop command to the third valve before transmitting the first stop command such that said third valve is operably adjusted from the open operating state to the closed operating state in response to the third stop command to terminate the flow of a third gridline material portion through the third orifices.

6. The micro-extrusion system according to claim 1,
wherein said gridline material feed system comprises a pressurized container disposed such that said gridline material is supplied in a first portion of said supply flow path at a first pressure; and
wherein said controller is further configured to transmit a first command to said first and second valves, whereby each of said first and second valves is operably adjusted from a closed operating state to an associated open operating state such that a corresponding portion of the gridline material is passed by each of said first and second valves through said first and second inlet ports into said printhead at a corresponding inlet pressure.

7. The micro-extrusion system according to claim 6, wherein each of the first and second valves is individually calibrated to produce said corresponding inlet pressures such that an outlet flow rate of said gridline material extruded through said first outlet orifices is substantially equal to an outlet flow rate of said gridline material extruded through said second outlet orifices.

8. The micro-extrusion system according to claim 7, wherein each of the first and second valves comprises:
an outer case defining an inner chamber, a valve inlet port and a valve outlet port;
a fixed seal structure disposed inside the outer case between a first chamber portion and a second chamber portion, the fixed seal structure including a seal that defines a central opening;
an actuator disposed outside of the outer case; and
a piston including a shaft having a first end operably connected to the actuator and a second end extending into the first chamber portion, and a stopper fixedly attached to the second end of the shaft,
wherein when each of said first and second valves is in the opened operating state, the actuator pushes the piston into the outer case such that the stopper is disposed in the second chamber portion, whereby gridline material entering the first chamber portion through the valve inlet port passes through the central opening into the second chamber portion and out of the outer case by way of the valve outlet port, and
wherein when each of said first and second valves is in the closed operating state, the stopper is disposed in the central opening such that the flow of gridline material through said central opening is prevented.

9. The micro-extrusion system according to claim 1,
a sacrificial material feed system for supplying a sacrificial material along a second supply flow path;
a third valve disposed in the second supply flow path between the sacrificial material feed system and a third inlet port defined in said printhead;a fourth valve disposed in the second supply flow path between the sacrificial material feed system and a fourth inlet port defined in said printhead; and wherein said controller is further configured to control said third and fourth valves such that said sacrificial material is simultaneously supplied into said printhead at said print start time; and
wherein said printhead is constructed such that such that said gridline material and said sacrificial material are simultaneously co-extruded through said first outlet orifices to form said first gridline structures, and through said second outlet orifices to form said second gridline structures, wherein each of said first and second gridline structures comprise a central high-aspect ratio gridline material structure disposed between two sacrificial material portions.

10. The micro-extrusion system according to claim 9, wherein said controller is further configured to transmit simultaneously a first command to an actuator of each of said first, second, third and fourth valves such that each said actuator positions a stopper away from a seal structure, whereby said first and second valves are operably adjusted into open operating states such that a first portion of the gridline material is passed by said first valve through said first inlet port and is extruded through said first outlet orifices, and such that a second portion of the gridline material is passed by said second valve through said second inlet port and is extruded through said second outlet orifices, and whereby said third and fourth valves are operably adjusted into open operating states such that a first portion of the sacrificial material is passed by said third valve through said third inlet port and is co-extruded with said first portion of the gridline material through said first outlet orifices, and such that a second portion of the sacrificial material is passed by said fourth valve through said fourth inlet port and is co-extruded with said second portion of the gridline material through said second outlet orifices.

11. The micro-extrusion system according to claim 9, wherein said controller is further configured to transmit a second command to said actuator to each of said second and fourth valves when the pseudo-square substrate is in a second position relative to the printhead, and configured to transmit a third command to each of the first and third valves when the pseudo-square substrate is in a third position relative to the printhead.

12. The micro-extrusion system according to claim 9,
wherein said gridline material feed system comprises a first pressurized container disposed such that said gridline material is supplied in a first portion of said supply flow path at a first initial pressure;
wherein said sacrificial material feed system comprises a second pressurized container disposed such that said sacrificial material is supplied in a first portion of said second supply flow path at a second initial pressure; and
wherein said controller is further configured to transmit simultaneously a first command to each of said first, second, third and fourth valves, whereby each of said first and second valves is operably adjusted from a closed operating state to an associated open operating state such that a corresponding portion of the gridline material is passed by each of said first and second valves through said first and second inlet ports into said printhead at a corresponding inlet pressure, and such that a corresponding portion of the sacrificial material is passed by each of said third and fourth valves through said third and fourth inlet ports into said printhead at a corresponding inlet pressure.

13. The micro-extrusion system according to claim 12, wherein each of said first, second, third and fourth valves comprise:

an outer case defining an inner chamber, a valve inlet port and a valve outlet port;

a fixed seal structure disposed inside the outer case between a first chamber portion and a second chamber portion, the fixed seal structure including a seal that defines a central opening;

an actuator disposed outside of the outer case; and a piston including a shaft having a first end operably connected to the actuator and a second end extending into the first chamber portion, and a stopper fixedly attached to the second end of the shaft, wherein when each of said first and second valves is in the opened operating state, the actuator pushes the piston into the outer case such that the stopper is disposed in the second chamber portion, whereby material entering the first chamber portion through the valve inlet port passes through the central opening into the second chamber portion and out of the outer case by way of the valve outlet port, and wherein when each of said first and second valves is in the closed operating state, the stopper is disposed in the central opening such that the flow of material through said central opening is prevented.

14. The micro-extrusion system according to claim 13, wherein the piston of each of said first, second, third and fourth valves is operably positioned inside said outer casing when said each of said first, second, third and fourth valves is in the opened operating position such that both the gridline material and the sacrificial material are co-extruded from the first and second outlet orifices at a common outlet flow rate.

* * * * *